United States Patent
Harasaka et al.

(10) Patent No.: US 9,201,404 B2
(45) Date of Patent: Dec. 1, 2015

(54) ALKALI METAL CELL, ATOMIC OSCILLATOR, AND ALKALI METAL CELL FABRICATING METHOD

(71) Applicants: Kazuhiro Harasaka, Miyagi (JP); Kazuhiko Adachi, Miyagi (JP); Hiroyoshi Shouji, Miyagi (JP); Akihiro Itoh, Miyagi (JP); Shunichi Sato, Miyagi (JP); Shinji Satoh, Miyagi (JP)

(72) Inventors: Kazuhiro Harasaka, Miyagi (JP); Kazuhiko Adachi, Miyagi (JP); Hiroyoshi Shouji, Miyagi (JP); Akihiro Itoh, Miyagi (JP); Shunichi Sato, Miyagi (JP); Shinji Satoh, Miyagi (JP)

(73) Assignee: RICOH COMPANY, LTD., Tokyo (JP)

( * ) Notice: Subject to any disclaimer, the term of this patent is extended or adjusted under 35 U.S.C. 154(b) by 31 days.

(21) Appl. No.: 14/082,679

(22) Filed: Nov. 18, 2013

(65) Prior Publication Data
US 2014/0139294 A1    May 22, 2014

(30) Foreign Application Priority Data

Nov. 21, 2012 (JP) ................. 2012-255466
Nov. 22, 2012 (JP) ................. 2012-256053
Jun. 6, 2013 (JP) ................. 2013-119739

(51) Int. Cl.
  *G04F 5/14* (2006.01)
  *H03B 17/00* (2006.01)
  *H03L 7/26* (2006.01)

(52) U.S. Cl.
  CPC ............. *G04F 5/145* (2013.01); *H03B 17/00* (2013.01); *H03L 7/26* (2013.01)

(58) Field of Classification Search
  CPC ............. G04F 5/14; G04F 5/145; H01S 1/06; H03B 17/00; H03L 7/26
  USPC .................................................. 331/3, 94.1
  See application file for complete search history.

(56) References Cited

U.S. PATENT DOCUMENTS

| | | | |
|---|---|---|---|
| 6,806,784 B2 | 10/2004 | Hollberg et al. | |
| 7,931,794 B2 * | 4/2011 | Happer et al. | 205/406 |
| 2005/0007118 A1 | 1/2005 | Kitching et al. | |
| 2005/0046851 A1 * | 3/2005 | Riley et al. | 356/437 |

(Continued)

FOREIGN PATENT DOCUMENTS

| | | |
|---|---|---|
| JP | 2009-212416 | 9/2009 |
| JP | 2009-283526 | 12/2009 |

(Continued)

OTHER PUBLICATIONS

Svenja Knappe et al., "A microfabricated atomic clock", Applied Physics Letters, vol. 85, pp. 1460-1462, 2004.

(Continued)

*Primary Examiner* — Levi Gannon
(74) *Attorney, Agent, or Firm* — Cooper & Dunham LLP

(57) ABSTRACT

An alkali metal cell is disclosed, including a substrate in which is formed an opening which penetrates from one face to the other face thereof; a first transparent substrate bonded to the other face of the substrate; and a second transparent substrate bonded to the one face of the substrate, wherein an alkali metal is sealed into a space surrounded by the first transparent substrate and the second transparent substrate in the opening of the substrate, wherein, in the substrate and the second transparent substrate, the space is enclosed by a bonding between a first bonding metal layer formed by a first bonding metal and a second bonding metal layer formed by a second bonding metal, and wherein the second bonding metal layer has a bonding temperature higher than that of the first bonding metal layer.

16 Claims, 63 Drawing Sheets

(56) References Cited

U.S. PATENT DOCUMENTS

| | | | |
|---|---|---|---|
| 2005/0236460 A1* | 10/2005 | Abbink et al. | 228/101 |
| 2006/0022761 A1* | 2/2006 | Abeles et al. | 331/94.1 |
| 2008/0267232 A1* | 10/2008 | DeNatale | 372/27 |
| 2009/0174489 A1* | 7/2009 | Aoyama et al. | 331/94.1 |
| 2010/0102893 A1* | 4/2010 | Chindo et al. | 331/94.1 |
| 2010/0189605 A1* | 7/2010 | Schmid et al. | 422/102 |
| 2011/0187464 A1* | 8/2011 | Youngner et al. | 331/94.1 |
| 2012/0206135 A1 | 8/2012 | Nagasaka et al. | |
| 2013/0015920 A1* | 1/2013 | Sato et al. | 331/94.1 |

FOREIGN PATENT DOCUMENTS

| | | |
|---|---|---|
| JP | 2011-119633 | 6/2011 |
| JP | 2012-183290 | 9/2012 |
| JP | 2013-007720 | 1/2013 |
| JP | 2013-038382 | 2/2013 |
| JP | 2013-058563 | 3/2013 |

OTHER PUBLICATIONS

Li-Anne Liew et al., "Microfabricated alkali atom vapor cells", Applied Physics Letters, vol. 84, pp. 2694-2696, 2004.

S. Knappe et al., "Atomic vapor cells for chip-scale atomic clocks with improved long-term frequency stability", Optics Letters, vol. 30, pp. 2351-2353, 2005.

Li-Anne Liew et al., "Wafer-level filling of microfabricated atomic vapor cells based on thin-film deposition and photolysis of cesium azide", Applied Physics Letters, vol. 90, 114106, 2007.

Lukasz Nieradko et al., "New approach of fabrication and dispensing of micromachined cesium vapor cell", J. Micro/Nanolith, MEMS MOEMS 7(3), 033013, 2008.

Hiroyuki Ishida et al., "Low-Temperature Wafer Bonding for MEMS Hermetic Packaging Using Sub-micron Au Particles", Transactions on The Japan Institute of Electronics Packaging, vol. 3, No. 1, pp. 62-67, 2010.

* cited by examiner 111  113  112

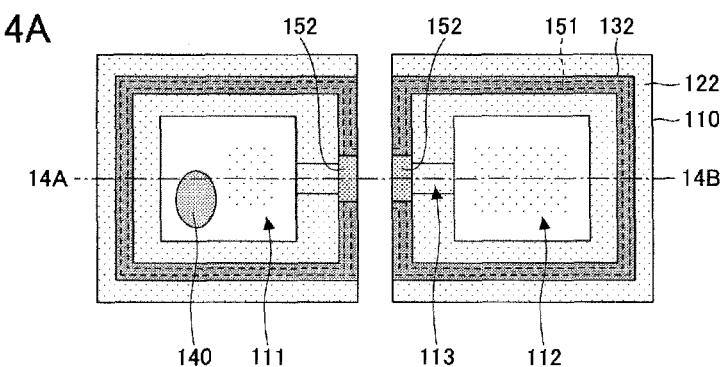
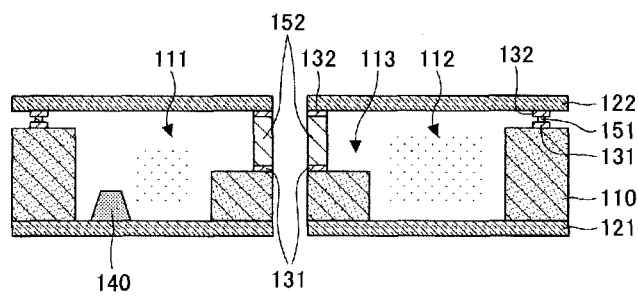
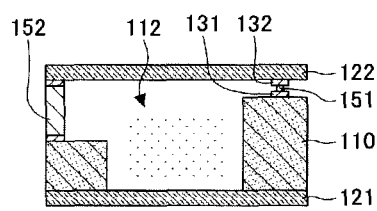

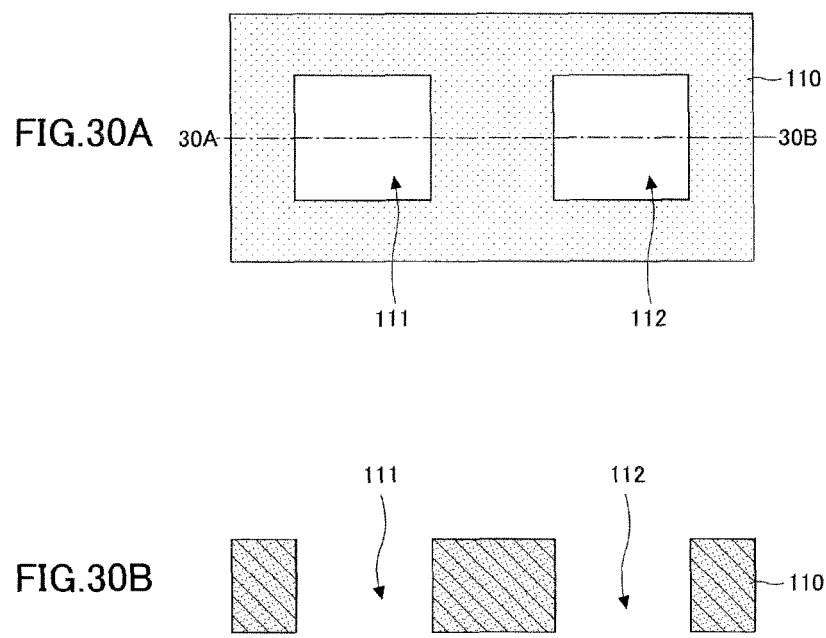

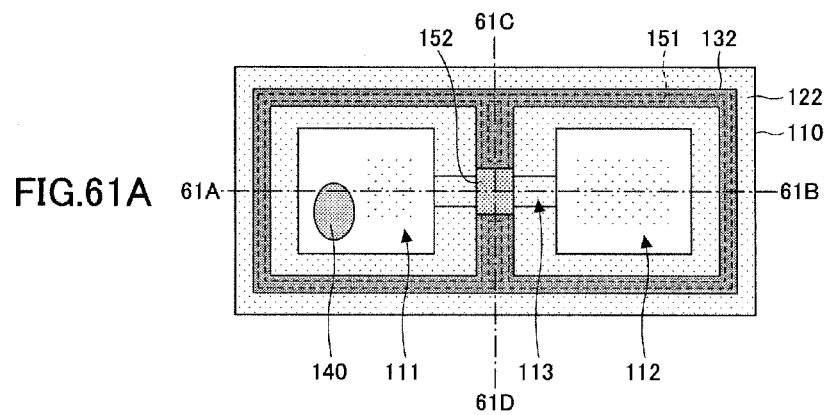

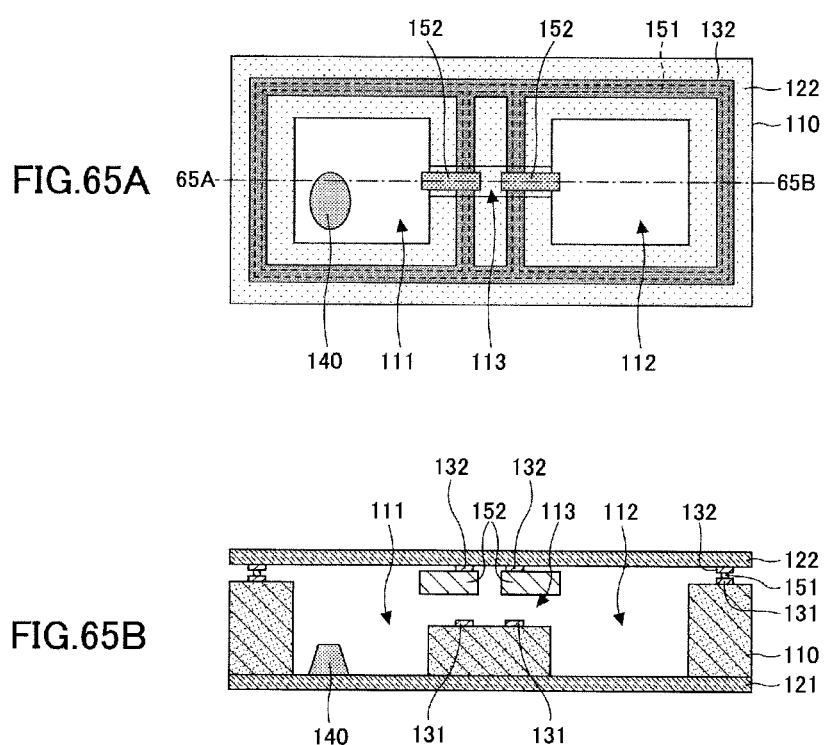

ALKALI METAL CELL, ATOMIC OSCILLATOR, AND ALKALI METAL CELL FABRICATING METHOD

TECHNICAL FIELD

The present invention relates to alkali metal cells, atomic oscillators, and alkali metal cell fabricating methods.

BACKGROUND ART

There is an atomic clock (an atomic oscillator) as a clock which measures time in an extremely precise manner and techniques, etc., for miniaturizing the atomic clock are being studied. The atomic clock is an oscillator which has, as a reference, a transition energy amount of electrons which make up an atom of an alkali metal, etc.; in particular, a very precise value is obtained for transition energy of the electrons in the atom of the alkali metal when there is no disturbance, making it possible to obtain a few orders of magnitude higher frequency stability than that with a crystal oscillator.

In such an atomic clock, there are a few types. Of these, a CPT (coherent population trapping)-type atomic clock has around three orders of magnitude higher frequency stability than that with related art crystal oscillators, and also an ultra compact size and an ultra low power consumption may be expected therewith (Non-patent documents 1 and 2).

As shown in FIG. 1, in the CPT-type atomic clock which includes a light source 910 such as a laser device, etc.; an alkali metal cell 940 in which the alkali metal is sealed; and a photo detector 950 for receiving a laser light passing through the alkali metal cell 940, the laser light is modulated and excited by sideband wavelengths which appear on both sides of a carrier wave being a specific wavelength causing two transitions of electrons in an alkali metal atom to be simultaneously conducted. The transition energy in this transition is invariant, and a clearing response occurs in which a light absorbance in the alkali metal decreases when the sideband wavelengths of the laser light match a wavelength corresponding to the transition energy. In this way, it is an atomic clock, wherein a wavelength of the carrier wave is adjusted such that the light absorbance by the alkali metal decreases; a signal detected in the photo detector 950 is fed back to a modulator 960; and a modulation frequency of the laser light from the light source 910 such as the laser device, etc., is adjusted by the modulator 960. The laser light is emitted by the light source 910 and irradiated to the alkali metal cell 940 via a collimating lens 920 and a $\lambda/4$ plate 930.

Methods are disclosed of producing an alkali metal cell in such an ultraminiature atomic clock using an MEMS (micro electro mechanical systems) technique (Patent Documents 1-4). In the methods disclosed therein, first an opening is formed on an Si substrate by a photolithography technique and an etching technique, after which a glass and the Si substrate are anodically bonded. The anodic bonding is carried out by applying a voltage of around 250 V to 1000 V to an interface between the glass and the Si substrate at a temperature of between 200° C. and 450° C. After putting in the alkali metal and a buffer gas, an opening portion to be a top face is sealed by anodically bonding the glass thereto. What is formed in this way is diced for each cell, so that the alkali metal cell is formed.

Methods of sealing the alkali metal within the cell include a method in which Cs (Cesium) metal is directly injected in a vacuum to be sealed (Non-patent Document 3); a method in which a solution in which CsCl is mixed with a $BaN_6$ aqueous solution is injected in the cell and the Cs metal is produced by being reacted at 200° C. (Non-patent Document 3); a method in which the Cs metal is produced by reacting $BaN_6+CsCl$ in an ampoule with a heater and evaporated and transferred into the cell (Non-patent Document 4); a method in which, with a common evaporation scheme, a film of $CsN_3$ is formed in the cell and the cell is sealed, after which a UV light is irradiated thereon to produce Cs and $N_2$ (Non-patent Document 5); and a method in which, after a Cs dispenser, which is stable in atmosphere, is injected into the cell and the cell is sealed, a laser light is irradiated only onto the Cs dispenser to heat it, causing Cs to be produced (Non-patent Document 6).

Patent Documents

Patent Document 1: U.S. Pat. No. 6,806,784B;
Patent Document 2: NS2005/0007118A;
Patent Document 3: JP2009-212416A; and
Patent Document 4: JP2009-283526A, Non-Patent Documents Non-patent document 1: Applied Physics Letters, Vol. 85, pp. 1460-1462 (2004);
Non-patent document 2: Comprehensive Microsystems, vol. 3, pp. 571-612;
Non-patent document 3: Applied Physics Letters, Vol. 84, pp. 2694-2696 (2004);
Non-patent document 4: OPTICS LETTERS, Vol. 30, pp. 2351-2353 (2005);
Non-patent document 5: Applied Physics Letters, Vol. 90, 114106 (2007);
Non-patent document 6: J. Micro/Nanolith, MEMS MOEMS 7 (3), 033013 (2008); and
Non-patent document 7: Transactions on The Japan Institute of Electronics Packaging, Vol. 3, No. 1, pp. 62-67, 2010.

When the cell is sealed by anodic bonding, oxygen, OH, $H_2O$, etc., that are produced in the anodic bonding react with the alkali metal in the cell. For example, in a case of Cs, $Cs_xO_y$, etc., are produced. Thus, there is a problem that transmittance of the laser light changes, causing a frequency shift and causing short-term stability of frequency to be degraded.

Moreover, with the method disclosed in Non-patent document 6, the Cs dispenser which produced the Cs remaining in the cell adsorbs gas within the cell. Thus, there is a problem that pressure within the cell changes, thereby causing a frequency shift and causing a reduced long-term reliability as a frequency oscillator.

DISCLOSURE OF THE INVENTION

In light of the problems as described above, an object of the present invention is to provide a highly reliable and stable alkali metal cell and atomic oscillator by providing an alkali metal cell which does not contain a material as a source of supplying Cs and which contains little impurities such as oxygen, etc., in a cell.

According to an embodiment of the present invention, an alkali metal cell is provided, including a substrate in which is formed an opening which penetrates from one face to the other face thereof; a first transparent substrate bonded to the other face of the substrate; and a second transparent substrate bonded to the one face of the substrate, wherein an alkali metal is sealed into a space surrounded by the first transparent substrate and the second transparent substrate in the opening of the substrate, wherein, in the substrate and the second transparent substrate, the space is enclosed by a bonding between a first bonding metal layer formed by a first bonding metal and a second bonding metal layer formed by a second bonding metal, and wherein the second bonding metal layer has a bonding temperature higher than that of the first bonding metal layer.

The present invention makes it possible to provide a highly reliable and stable alkali metal cell and atomic oscillator by providing an alkali metal cell which does not contain a material as a source of supplying Cs and which contains little impurities such as oxygen, etc., in the cell.

BRIEF DESCRIPTION OF THE DRAWINGS

Other objects, features, and advantages of the present invention will become more apparent from the following detailed descriptions when read in conjunction with the accompanying drawings, in which:

FIGS. 14A and 14B are thirteenth parts of the process chart of the alkali metal cell fabricating method according to the first embodiment;

FIG. 15 is a structural diagram of an alkali metal cell according to the first embodiment;

FIGS. 30A and 30B are second parts of the process chart of the alkali metal cell fabricating method according to the fifth embodiment;

FIGS. 61A to 61C are sixth parts of the process chart of the alkali metal cell fabricating method according to the eighth embodiment;

FIGS. 65A and 65B are third parts of the diagram for explaining the alkali metal cell fabricating method according to the ninth embodiment;

BEST MODE FOR CARRYING OUT THE INVENTION

Below, embodiments for carrying out the present invention are described with reference to the drawings. In the respective drawings, the same letters are applied to the same members, etc., so that duplicate explanations may be omitted.

First Embodiment

An alkali metal cell and an alkali metal cell fabricating method according to a first embodiment are described based on FIGS. 2A to 14B.

Figure 1:
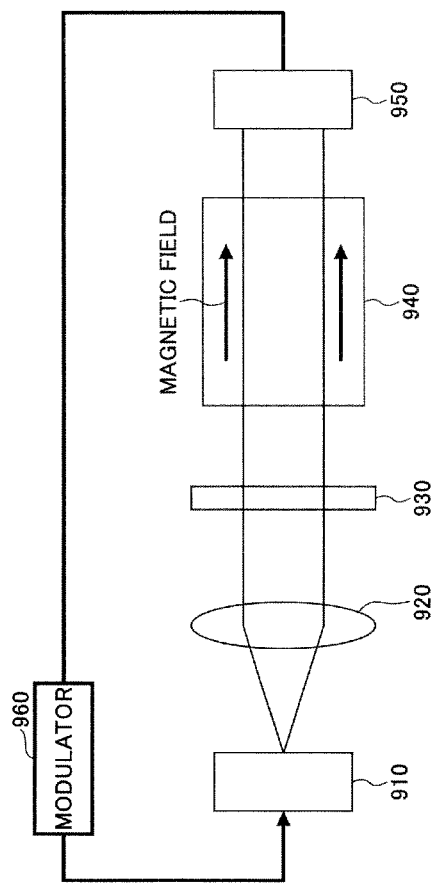
FIG. 1 is a diagram for explaining an atomic oscillator.
Figure 2A:
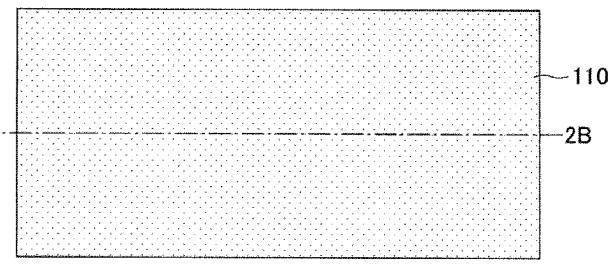
FIGS. 2A and 2B are first parts of a process chart of an alkali metal cell fabricating method according to a first embodiment.
Figure 2B:

First, as illustrated in FIGS. 2A and 2B, an Si (silicon) substrate 110 is prepared. This Si substrate 110 has a thickness of 1.5 mm and has both faces thereof mirror finished. FIG. 2A is a top face view in this process, while FIG. 2B is a sectional view cut in a dot-dash line 2A-2B in FIG. 2A.

Figure 3A:
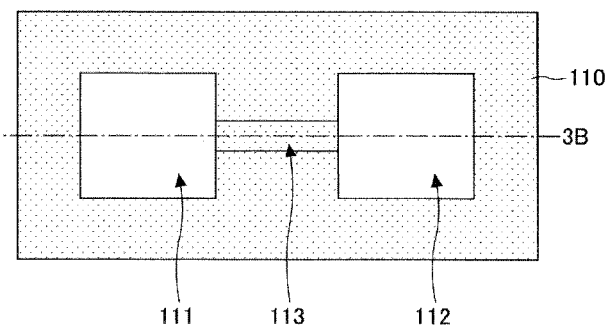
FIGS. 3A and 3B are second parts of the process chart of the alkali metal cell fabricating method according to the first embodiment.
Figure 3B:
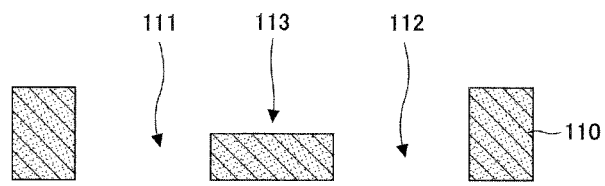

Next, as shown in FIGS. 3A and 3B, two openings, or, in other words, a first opening 111 and a second opening 112; and a groove 113 between the first opening 111 and the second opening 112 are formed in the Si substrate 110. The first opening 111 and the second opening 112 that are formed in the Si substrate 110 penetrate the Si substrate 110, while the groove 113 is formed on only one face of the Si substrate 110, not penetrating the Si substrate 110. In the present embodiment, the first opening 111 may be referred to as one opening, while the second opening 112 may be referred to as the other opening. FIG. 3A is a top face view in this process, while FIG. 3B is a sectional view cut in a dot-dash line 3A-3B in FIG. 3A.

More specifically, a photo resist is coated onto one face of the Si substrate 110 and exposed and developed by an aligner, thereby forming a resist pattern (not shown) which has an opening in an area in which the first opening 111, the second opening 112, and the groove 113 are formed. Thereafter, by dry etching such as ICP (inductively coupled plasma) etching, etc., Si in an area in which the resist pattern is not formed is removed up to half a depth of a thickness of the Si substrate 110, forming a recess. In this way, on one face of the Si substrate 110, a part of the first opening 111 and the second opening 112 as well as the groove 113 are formed.

Thereafter, the photo resist is coated onto the other face of the Si substrate 110 and exposed and developed by the aligner, thereby forming a resist pattern (not shown) which has an opening in an area in which the first opening 111 and the second opening 112 are formed. Thereafter, by the dry etching such as the ICP etching, etc., Si in an area in which the resist pattern is not formed is removed and the first opening 111 and the second opening 112 are formed by penetrating the Si substrate 110. As the groove 113 is formed on only the one face of the Si substrate 110, it does not penetrate the Si substrate 110. Dry etching in the Si substrate 110 is carried out by a Bosch process in which etching is conducted by alternately supplying $SF_6$ and $C_4F_8$. The Bosch process makes it possible to conduct highly anisotropic etching at high speed in the Si substrate 110. Power applied in this ICP etching is 2 kW.

Moreover, other than the above-described drying etching, the first opening 111, the second opening 112, and the groove 113 can also be formed by wet etching. More specifically, an SiN film (not shown) is formed on both faces of the Si substrate 110 by low pressure CVD (chemical vapor deposition). Thereafter, a photo resist is coated on the formed SiN film, and exposed and developed by the aligner. In this way, on one face of the Si substrate 110, a resist pattern (not shown) is formed which has an opening in an area in which are formed the first opening 111, the second opening 112, and the groove 113. Moreover, on the other face thereof, a resist pattern (not shown) is formed which has an opening in an area in which are formed the first opening 111 and the second opening 112.

Thereafter, by conducting dry etching using $CF_4$ as an etching gas, the SiN film is removed in the area in which the resist pattern is not formed, and, moreover, a resist pattern (not shown) is removed. Thereafter, by conducting wet etching using a KOH (30 wt %) solution at a temperature of 85° C., in the Si substrate 110, Si in the area in which the SiN film is not formed is removed, forming the first opening 111, the second opening 112, and the groove 113. Here, the first opening 111 and the second opening 112 are removed from both faces of the one face and the other face of the Si substrate 110, making it possible to penetrate the Si substrate 110. As the groove 113 is removed from the one face of the Si substrate 110, it does not penetrate the Si substrate 110. Thereafter, the SiN film is removed by dry etching, or wet etching using a solution for removing SiN. The wet etching of the Si substrate 110 that is conducted here is anisotropic etching, possibly causing a reverse slope of an inclination angle of 54.7° on a side face of the first opening 111, the second opening 112, and the groove 113 formed.

Figure 4A:
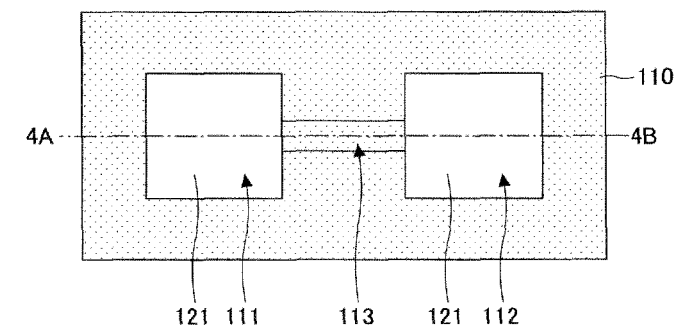
FIGS. 4A and 4B are third parts of the process chart of the alkali metal cell fabricating method according to the first embodiment.
Figure 4B:
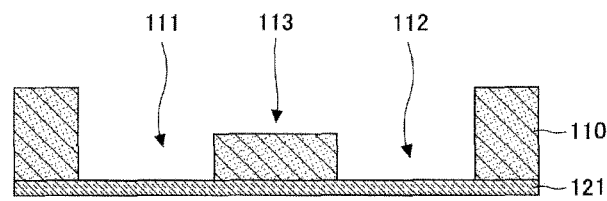

Next, as illustrated in FIGS. 4A and 4B, a first glass substrate 121, which is a first transparent substrate, is anodically bonded to the other face of the Si substrate 110. More specifically, in a low pressure chamber, the first glass substrate 121 is made in contact to the other face of the Si substrate 110 and is anodically bonded thereto by applying −800 V to the first glass substrate 121 at 380° C. In this way, the other face side of the first opening 111 and the second opening 112 that are formed in the Si substrate 110 is blocked by the first glass substrate 121. In this process, since an alkali metal material, etc., are not provided, the alkali metal is not oxidized due to oxygen, etc., produced by the anodic bonding. While a case of anodic bonding is explained in the above, the other face of the Si substrate 110 and the first glass substrate 121 may be bonded by direct bonding rather than by the anodic bonding. FIG. 4A is a top face view in this process, while FIG. 4B is a sectional view cut in a dot-dash line 4A-4B in FIG. 4A.

Figure 5A:
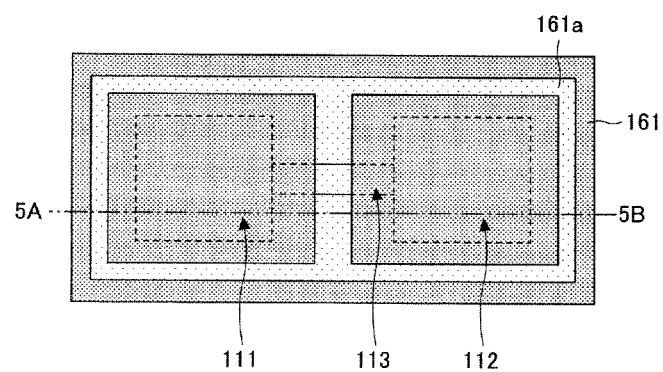
FIGS. 5A and 5B are fourth parts of the process chart of the alkali metal cell fabricating method according to the first embodiment.
Figure 5B:
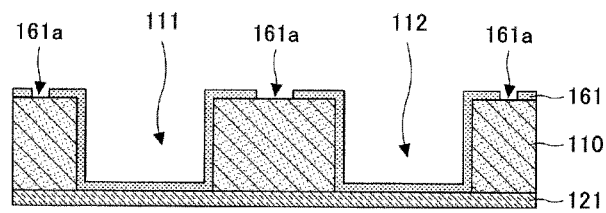

Next, as illustrated in FIG. 5, a resist pattern 161 having an opening 161a in an area in which a below-described bonding part metal film is formed is formed on one face of the Si substrate 110. More specifically, a photo resist is coated onto the one face of the Si substrate 110 and exposed and developed by an aligner, so that the resist pattern 161 having the opening 161a is formed. When the resist pattern is formed, the photo resist is coated without omission along a wall face inside the first opening 111 and the second opening 112 that are formed in the Si substrate 110, so that spray coating for spraying liquid in which the photo resist and gas are mixed may be used. FIG. 5A is a top face view in this process, while FIG. 5B is a sectional view cut in a dot-dash line 5A-5B in FIG. 5A.

Figure 6A:
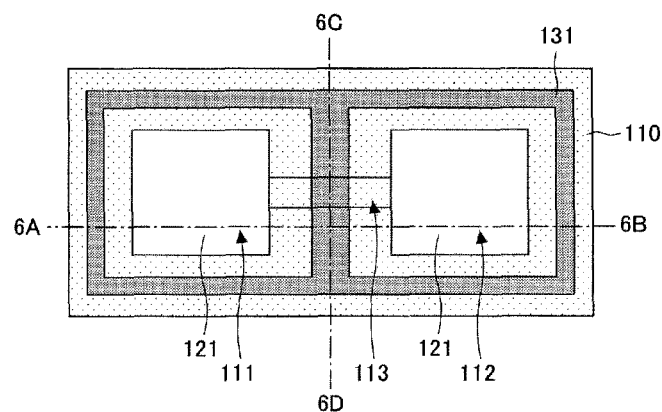
FIGS. 6A to 6C are fifth parts of the process chart of the alkali metal cell fabricating method according to the first embodiment.
Figure 6B:
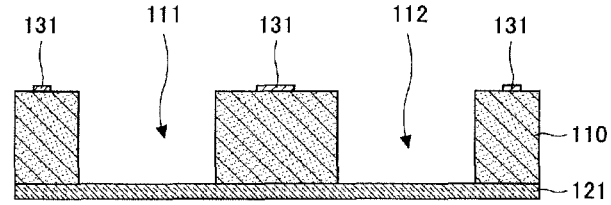
Figure 6C:
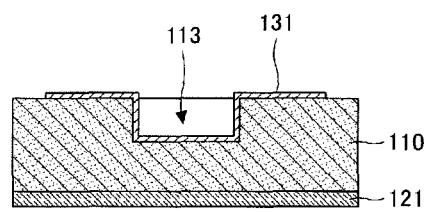

Next, as shown in FIGS. 6A to 6C, a bonding part metal film 131 is formed on one face of the Si substrate 110. More specifically, a metal laminated film containing Au: 700 nm/Cr: 10 nm is formed by sputtering, vacuum deposition, etc., on a face on which the resist pattern 161 is formed. Thereafter, by soaking into an organic solvent, etc., the metal laminated film formed on the resist pattern 161 is removed by a lift-off with the resist pattern 161, so that the bonding part eta film 131 is formed by a remaining metal laminated film. FIG. 6A is a top face view in this process; FIG. 6B is a sectional view cut in a dot-dash line 6A-6B in FIG. 6A; and FIG. 6C is a sectional view cut in a dot-dash line 6C-6D in FIG. 6A.

Figure 7A:
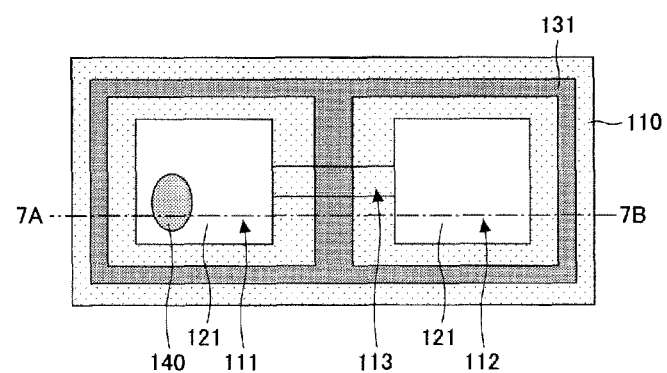
FIGS. 7A and 7B are sixth parts of the process chart of the alkali metal cell fabricating method according to the first embodiment.
Figure 7B:
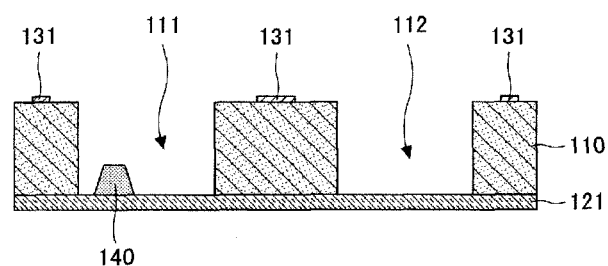

Next, as shown in FIGS. 7A and 7B, a Cs dispenser which is a compound 140 containing an alkali metal such as Cs, Rb, etc., is provided on the first glass substrate 121, etc., in the first opening 111 formed in the Si substrate 110. In the present embodiment, such an area formed by the first opening 11 in which the compound 140 containing the alkali metal is provided may be described as a raw material chamber. FIG. 7A is a top face view in this process, while FIG. 7B is a sectional view cut in a dot-dash line 7A-7B in FIG. 7A.

Figure 8A:
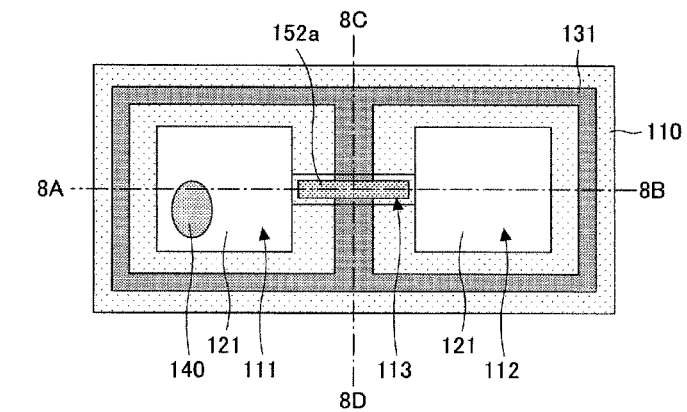
FIGS. 8A to 8C are seventh parts of the process chart of the alkali metal cell fabricating method according to the first embodiment.
Figure 8B:
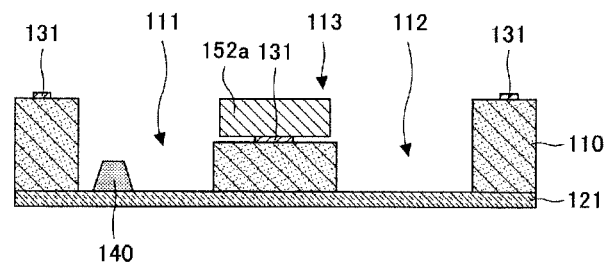
Figure 8C:
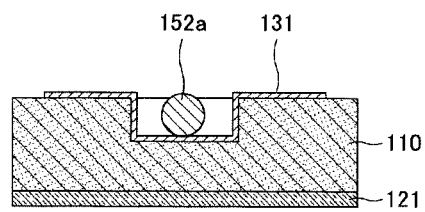

Next, as shown in FIGS. 8A to 8C, a second bonding metal member 152a formed by a second bonding metal is provided in the groove 113. The second bonding metal is an alloy of Au and Sn and is formed linearly, for example. In the present embodiment, the second bonding metal which forms the second bonding metal member 152a is an alloy of Au: 80% and Sn: 20% and the melting temperature is 280° C. FIG. 8A is a top face view in this process; FIG. 8B is a sectional view cut in a dot-dash line 8A-8B in FIG. 8A; and FIG. 8C is a sectional view cut in a dot-dash line 8C-8D in FIG. 8A.

Figure 9A:
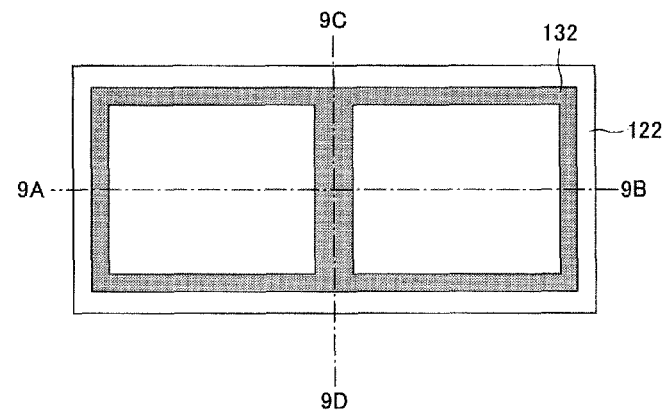
FIGS. 9A to 9C are eighth parts of the process chart of the alkali metal cell fabricating method according to the first embodiment.
Figure 9B:
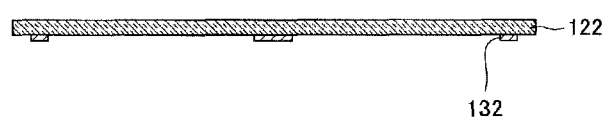
Figure 9C:
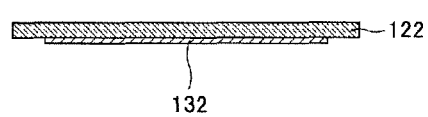

Next, as illustrated in FIGS. 9A-9C, a second glass substrate 122 which is a second transparent substrate is prepared and a bonding part metal film 132 is formed on one face of the second glass substrate 122. More specifically, the photo resist is coated onto one face of the second glass substrate and exposed and developed by the aligner, forming a resist pattern (not shown) which has an opening in an area in which the bonding part metal film 132 is formed. Thereafter, a metal laminated film containing Au: 700 nm/Cr: 10 nm is formed by sputtering, vacuum deposition, etc. on a face on which the resist pattern is formed. Thereafter, by soaking into an organic solvent, etc., the metal laminated film formed on the resist pattern is removed by a lift-off with the resist pattern, so that the bonding part metal film 132 is formed by a metal laminated film remaining on one face of the second glass substrate 122. The bonding part metal film 132 formed in this way is formed at such a position as to oppose the bonding part metal film 131 formed on one face of the Si substrate 110. FIG. 9A is a top face view in this process; FIG. 9B is a sectional view cut in a dot-dash line 9A-9B in FIG. 9A; and FIG. 9C is a sectional view cut in a dot-dash line 9C-9D in FIG. 9A.

Figure 10A:
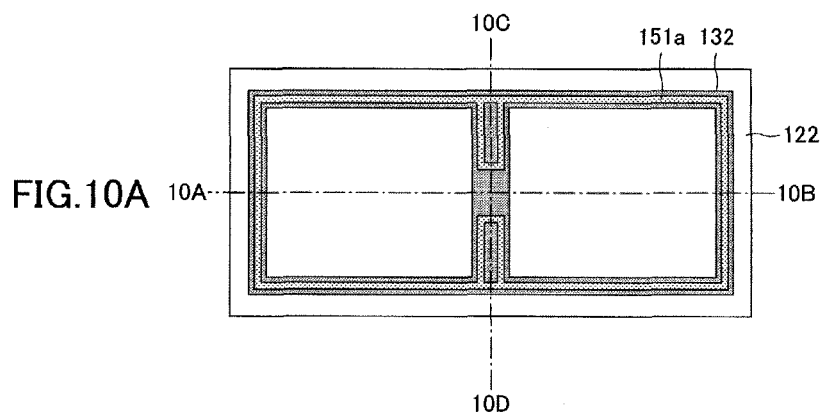
FIGS. 10A to 10C are ninth parts of the process chart of the alkali metal cell fabricating method according to the first embodiment.
Figure 10B:
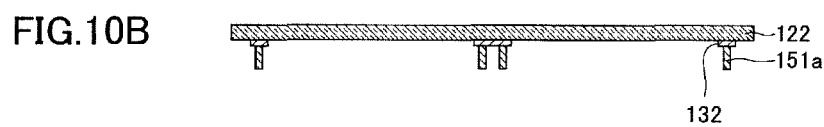
Figure 10C:
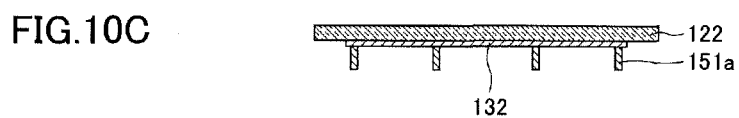

Next, as shown in FIG. 10, a first bonding metal member 151a which is formed by metal fine particles being a first bonding metal is formed on the bonding part metal film 132 of the second glass substrate 122. The first bonding metal member 151 may be described as a metal fine particle layer since it is formed by the metal fine particles. In the present embodiment, the metal fine particles which form the first bonding metal member 151a are fine particles of Au with a particle diameter of between 0.05 μm and 1 μm and are formed on the bonding part metal film 132 of the second glass substrate 122 by screen printing with a cured resist as a mask. As described below, in order to bond at a low temperature of approximately 200° C. by the first bonding metal member 151a, it is preferable that the particle diameter of the metal fine particles which form the first bonding metal member 151a is between 0.05 μm and 1 μm. The first bonding metal member 151a formed in this way has a width of approximately 20 μm and a thickness of approximately 20 μm. FIG. 10A is a top face view in this process; FIG. 10B is a sectional view cut in a dot-dash line 10A-10B in FIG. 10A; and FIG. 10C is a sectional view cut in a dot-dash line 10C-10D in FIG. 10A.

Figure 11A:
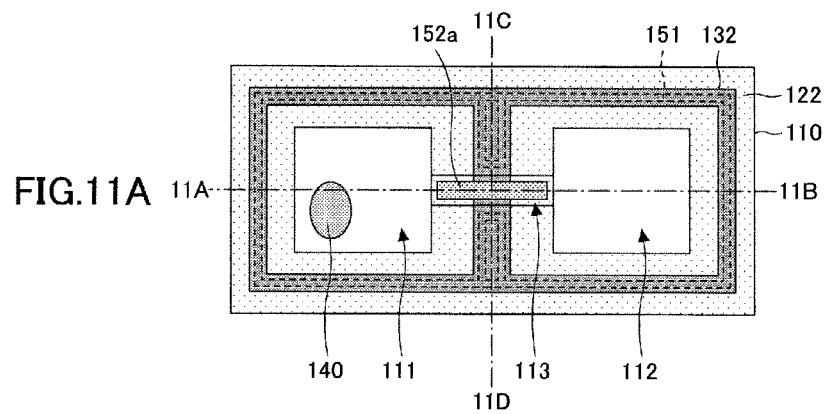
FIGS. 11A to 11C are tenth parts of the process chart of the alkali metal cell fabricating method according to the first embodiment.
Figure 11B:
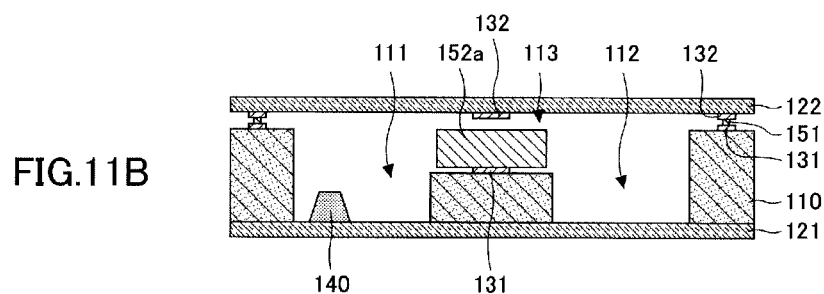
Figure 11C:
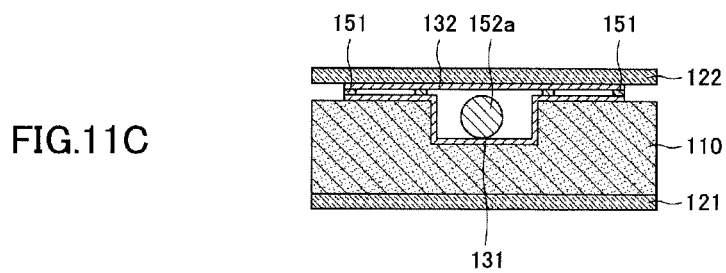

Next, as shown in FIGS. 11A-11C, the one face of the Si substrate 110 and the one face of the second glass substrate 122 are bonded by a first bonding metal layer 151 which is formed by the first bonding metal member 151a. FIG. 11A is a top face view in this process; FIG. 11B is a sectional view cut in a dot-dash line 11A-11B in FIG. 11A; and FIG. 11C is a sectional view cut in a dot-dash line 11C-11D in FIG. 11A.

More specifically, in a vacuum chamber into which nitrogen gas to be a buffer gas is introduced to produce the nitrogen atmosphere, the bonding part metal film 131 which is formed on one face of the Si substrate 110 is made in contact with the first bonding metal member 151a which is formed on one face of the second glass substrate 122. Thereafter, at an increased temperature of approximately 200° C., pressurizing at 100 MPa is conducted for 30 minutes. This causes the one face of the Si substrate 110 and the one face of the second glass substrate 122 to be bonded by the first bonding metal layer 151 which is formed through application by the first bonding metal member 151a. In this way, the one face side of the first opening 111 and the second opening 112 in the Si substrate 110 has the second glass substrate 122 bonded by the first bonding metal layer 151 and is blocked by the second glass substrate 122. In this way, an enclosed space including the first opening 111, the second opening 112, and the groove 113 is formed.

In such a bonding using the metal fine particles, gas such as oxygen, etc., is not produced at the time of bonding, so that impurities such as oxygen, etc., do not enter the first opening 111 in which the compound 140 containing the alkali metal is placed. Moreover, once applied, Au fine particles which are metal fine particles do not melt unless they are heated to the melting point (approximately 1000° C.) of Au. Thus, even when they are reheated to a bonding temperature (approximately 200° C.) or above in the metal fine particle layer which is the first bonding metal member 151a, a portion bonded by the first bonding metal layer 151 does not melt as long as the temperature is less than or equal to approximately 1000° C. Thus, even when reheated to the bonding temperature or above, gas inside the first opening 111; the second opening 112; and the groove 113 does not leak out at less than or equal to approximately 1000° C.

At this bonding temperature (approximately 200° C.), the melting temperature of the second bonding metal forming the second bonding metal member 152a is 280° C., so that the second bonding metal member 152a does not melt. Thus, even though the second bonding metal member 152a is provided, in this process, a state is maintained in which a space in the first opening 111 and a space in the second opening 112 are spatially connected via the groove 113.

Figure 12A:
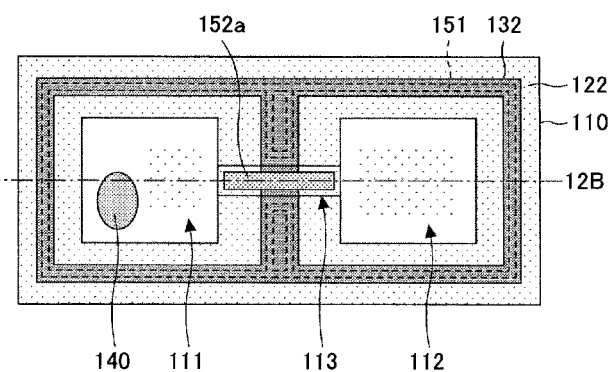
FIGS. 12A and 12B are eleventh parts of the process chart of the alkali metal cell fabricating method according to the first embodiment.
Figure 12B:
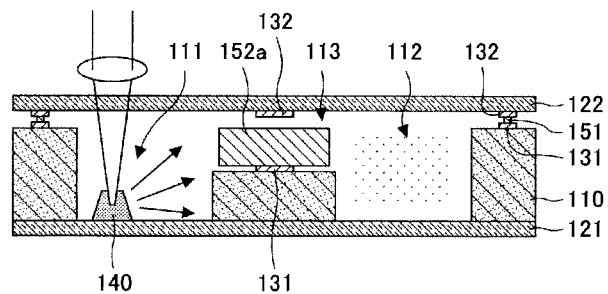

Next, as illustrated in FIGS. 12A and 12B, an alkali metal gas is produced by the compound 140 containing the alkali metal that is provided in the first opening 111. FIG. 12A is a top face view in this process, while FIG. 12B is a sectional view cut in a dot-dash line 12A-12B in FIG. 12A.

More specifically, when using a Cs dispenser, which is stable in the atmosphere as the compound 140 containing the alkali metal, a laser light is irradiated onto the Cs dispenser which is provided in the first opening 111 to heat, producing Cs gas (an alkali metal gas). Heating is conducted by collecting the irradiated laser light onto the compound 140 containing the alkali metal, so that the second bonding metal member 152a which is formed by the second bonding metal with a melting temperature of 280° C. does not melt. The melting point of Cs contained in the Cs dispenser, which is the compound 140 containing the alkali metal, is approximately 28° C.; the compound 140 containing the alkali metal is irradiated by the laser light and heated to at least the melting temperature, causing Cs to become liquid and gas. Cs, which became gas, etc., passes through the groove 113 and enters the second opening 112. In addition to the above-described method of producing the alkali metal gas by irradiating the laser light onto the compound 140 containing the alkali metal, the alkali metal gas may be produced by directly heating the compound 140 containing the alkali metal or irradiating an ultraviolet light (UV light).

Figure 13A:
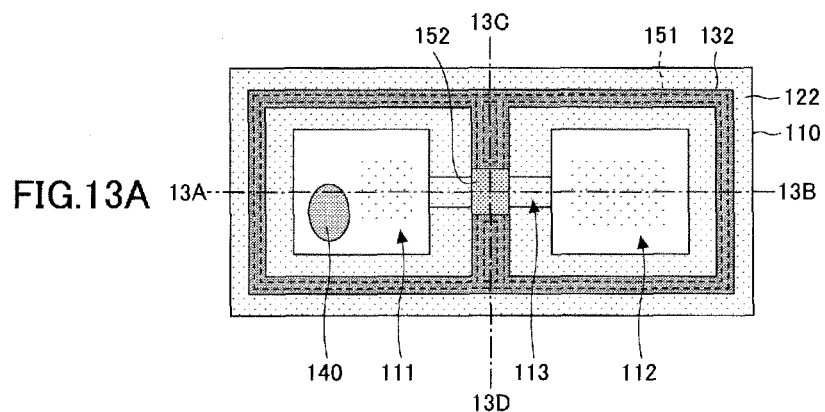
FIGS. 13A to 13C are twelfth parts of the process chart of the alkali metal cell fabricating method according to the first embodiment.
Figure 13B:
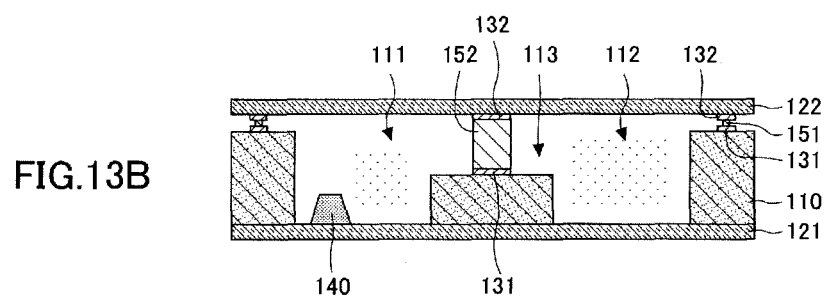
Figure 13C:
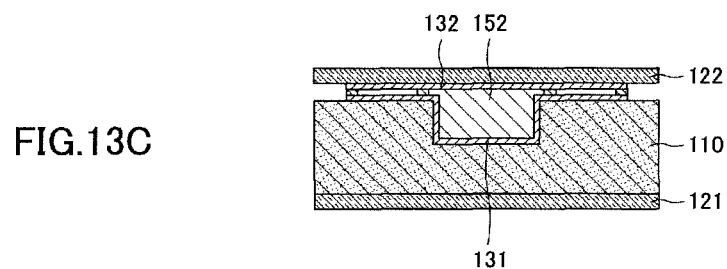

Next, as illustrated in FIGS. 13A to 13C, the second bonding metal member 152a which is provided in the groove 113 is heated to 280° C. or above, melted, and then cooled to form a second bonding metal layer 152, blocking the groove 113. In this way, a gap between the space in the first opening 111 and the space in the second opening 112 is blocked, so that they are spatially separated. An AuSn alloy (with a weight ratio of Au:Sn=80:20), which is a second metal bonding metal forming the second bonding metal member 152a, is a type of brazing material with superior wettability. Therefore, when the AuSn alloy (with the weight ratio of Au:Sn=80:20), which is the second bonding metal, is heated to turn to liquid, it becomes easy to wet spread to the bonding part metal films 131 and 132 which are formed by a metal material. Thus, cooling after heating to 280° C. or above may cause the groove 113 to be easily blocked by the second bonding metal layer 152 formed by the second bonding metal member 152a. Then, when the heating temperature is less than or equal to approximately 1000° C., the first bonding metal layer 151 does not melt, so that, in this process, the alkali metal gas does not leak out of a hole, etc., being made in the first bonding metal layer 151.

While a case of using the AuSn alloy (with the weight ratio of Au:Sn=80:20) as the second bonding metal has been described in the present embodiment, AuGe (with the weight ratio of Au:Ge=87.5:12.5), AuSi (with the weight ratio of Au:Si=96.8:3.2), etc., may be used. The melting temperature of AuGe (with the weight ratio of Au:Ge=87.5:12.5) is 361° C., while the melting temperature of AuSi (with the weight ratio of Au:Si=96.8:3.2) is 363° C. In the present embodiment, it suffices that the melting temperature of the second bonding metal is higher than the bonding temperature of the first bonding metal and lower than the melting point of the first bonding metal layer 151 formed by the first bonding metal. FIG. 13A is a top face view in this process. FIG. 13B a sectional view cut in a dot-dash line 13A-13B in FIG. 13A. FIG. 13C is a sectional view cut in a dot-dash line 13C-13D in FIG. 13A.

Next, as illustrated in FIGS. 14A and 143, an area in which the first opening 111 is formed and an area in which the second opening 112 is formed are cut by dicing, etc., and separated. FIG. 14A is a top face view in this process, while FIG. 14B is a sectional view cut in a dot-dash line 14A-14B in FIG. 14A.

With the area in which the second opening 112 is formed that is separated in this way, the alkali metal cell according to the present embodiment is formed. The alkali metal cell fabricated in such a process has a small amount of impurities such as oxygen, etc., contained in a cell inner part being the second opening 112, yielding a highly reliable and stable atomic oscillator when used as an atomic oscillator.

Moreover, when there remains, within the alkali metal cell, the compound 140 containing the alkali metal after releasing the alkali metal, it may adsorb gas inside the alkali metal cell, causing pressure within the alkali metal cell to change and reliability to decrease in this case. However, the compound 140 containing the alkali metal after releasing the alkali metal is not contained within the alkali metal cell in the present embodiment, making it possible to keep the pressure in the cell inner part that is the second opening 112 constant over a long term.

FIG. 15 illustrates an alkali metal cell according to the present embodiment. The alkali metal cell according to the present embodiment has the inside of the cell formed by the second opening 112, while the first glass substrate 121 is bonded to the other face of the Si substrate 110 by anodic bonding. Moreover, to the one face of the Si substrate 110 are bonded the second bonding metal layer 152 on which the second glass substrate 122 is formed by the second bonding metal member 152a and the first bonding metal layer 151 formed by the first bonding metal member 151a. Here, the temperature of bonding by the first bonding metal member 151a for forming the first bonding metal layer 151 is 200° C., while the temperature of bonding by the second bonding metal member 152a for forming the second bonding metal layer 152 is 280° C. Thus, the bonding temperature by the second bonding metal member 152a is higher than the bonding temperature by the first bonding metal member 151a. Moreover, the melting point of the first bonding metal layer 151 formed by the first bonding metal member 151a is approximately 1000° C., while the bonding temperature by the second bonding metal member 152a is a temperature which is lower than the melting temperature of the first bonding metal layer 151.

Furthermore, as described above, when the compound 140 containing the alkali metal cell is sealed in the cell inner part formed by the first opening 111, it is preferable to seal with a buffer gas such as nitrogen, etc., rather than within a vacuum. Colliding of alkali metal atoms in the cell inner part to a cell wall causes an internal state of the alkali metal atoms to change, causing frequency stability to decrease when used in the atomic oscillator. Thus, sealing the buffer gas such as nitrogen, etc., in the cell inner part makes it possible to decrease the probability of collision of the alkali metal atoms with the wall of the cell inner part and to suppress a decrease in the frequency stability. As the buffer gas, an inert gas is preferable, including nitrogen, neon, argon, a mixed gas of neon and argon, etc.

Figure 16:
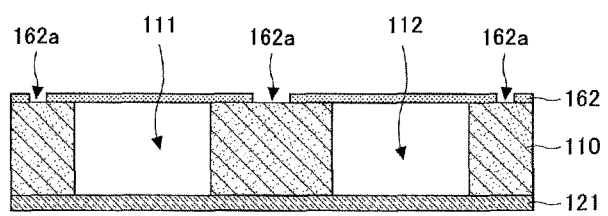
FIG. 16 is a diagram for explaining the alkali metal cell fabricating method according to the first embodiment.

Moreover, in the alkali metal cell fabricating method according to the present embodiment, a resist pattern 162 having openings 162a shown in FIG. 16 may be used instead of the resist pattern 161 having the openings 161a that is shown in FIGS. 5A and 5B. Such a resist pattern 162 may be formed by using a dry film resist. More specifically, the dry film resist is pasted to one face of the Si substrate 110 and is exposed and developed by the aligner, making it possible to form the resist pattern 162 having the openings 162a in areas in which the bonding part metal film 131 is formed. As for a subsequent process, a metal laminated film containing Au: 700 nm/Cr: 10 nm is formed by sputtering, vacuum deposition, etc., on a face on which the resist pattern 162 is formed as shown in FIGS. 6A-6C. Thereafter, by soaking in an organic solvent, etc., the metal laminated film formed on the resist pattern 162 is removed by a lift-off with the resist pattern 162, so that the bonding part metal film 131 is formed by a remaining metal laminated film.

Moreover, the first bonding metal member 151a may be formed on one face of the Si substrate 110, or may be formed on one face of the second glass substrate 122 as described above. Moreover, as described above, the second bonding metal member 152a may be provided in the groove 113 of the Si substrate 110, or may be provided, in a portion corresponding to the groove 113 in one face of the second glass substrate 122.

Second Embodiment

Next, the second embodiment is described. In the alkali metal cell and the alkali metal cell fabricating method according to the present embodiment, the second bonding metal member 152a is provided at two locations in the groove 113, taking into account a case of cutting by dicing.

Figure 17A:
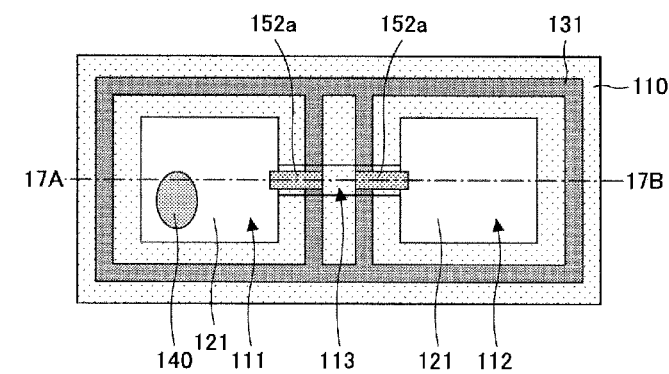
FIGS. 17A and 17B are first parts of the diagram for explaining the alkali metal cell fabricating method according to a second embodiment.
Figure 17B:
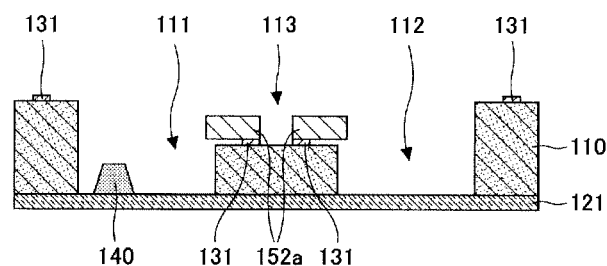

First, as illustrated in FIGS. 17A and 17B, the other face of the Si substrate 110 that has the first glass substrate 121 bonded thereto is fabricated. Two bonding part metal films 131 are formed on one face of the Si substrate 110 between the first opening 111 and the second opening 112 and the second bonding metal member 152a is provided on the bonding part metal film 131 on the first opening 111 side and on the second opening 112 side, respectively, in the groove 113. Moreover, the compound 140 containing the alkali metal is provided in the first opening 111. This process corresponds to the process illustrated in FIGS. 8A to 8C in the alkali metal cell fabricating method according to the first embodiment and the cell may be formed by a fabricating method similar to the first embodiment. FIG. 17A is a top face view in this process, while FIG. 17B is a sectional view cut in a dot-dash line 17A-17B in FIG. 17A.

Figure 18A:
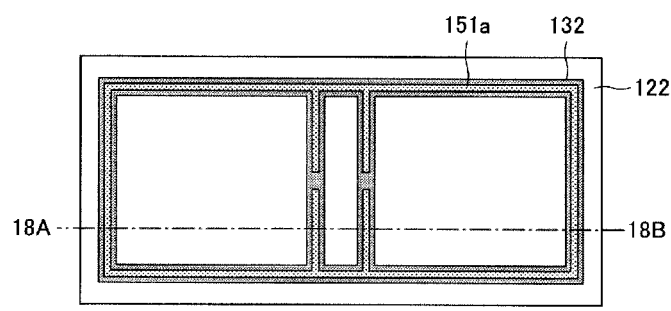
FIGS. 18A and 18B are second parts of the diagram for explaining the alkali metal cell fabricating method according to the second embodiment.
Figure 18B:
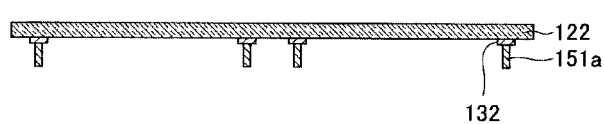

Next, as illustrated in FIGS. 18A and 18B, the bonding part metal film 132 is formed on one face of the second glass substrate 122, and the first bonding metal member 151a is formed on the bonding part metal film 132. In correspondence with the bonding part metal film 131 formed in the Si substrate 110 shown in FIGS. 17A and 17B, the bonding part metal film 132 and the first bonding metal member 151a are formed between the first opening 111 and the second opening 112. This process corresponds to the process illustrated in FIGS. 10A to 10C in the alkali metal cell fabricating method according to the first embodiment and may be formed by a fabricating method similar to the first embodiment. FIG. 18A is a top face view in this process, while FIG. 18B is a sectional view cut in a dot-dash line 18A-18B in FIG. 18A.

Figure 19A:
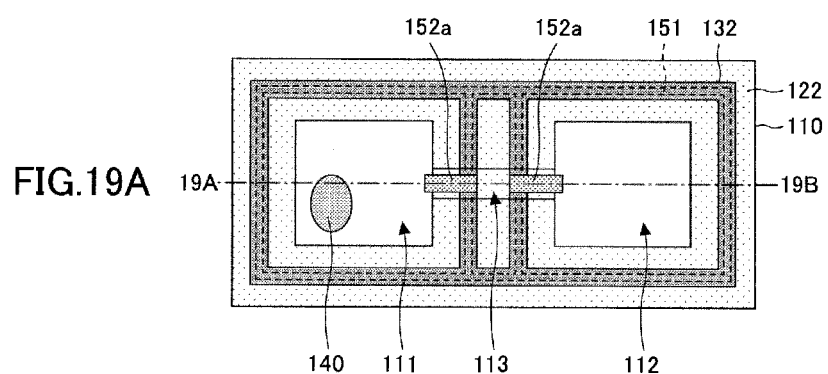
FIGS. 19A and 19B are third parts of the diagram for explaining the alkali metal cell fabricating method according to the second embodiment.
Figure 19B:
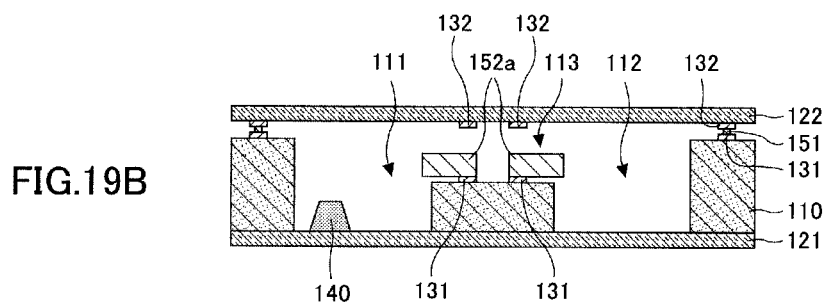

Next, as shown in FIGS. 19A and 19B, the one face of the Si substrate 110 and the one face of the second glass substrate 122 are bonded by the first bonding metal layer 151 which is formed by application by the first bonding metal member 151a. This process corresponds to the process illustrated in FIGS. 11A to 11C in the alkali metal cell fabricating method according to the first embodiment and may be formed by a fabricating method similar to the first embodiment. FIG. 19A is a top face view in this process, while FIG. 19B is a sectional view cut in a dot-dash line 19A-19B in FIG. 19A.

Figure 20A:
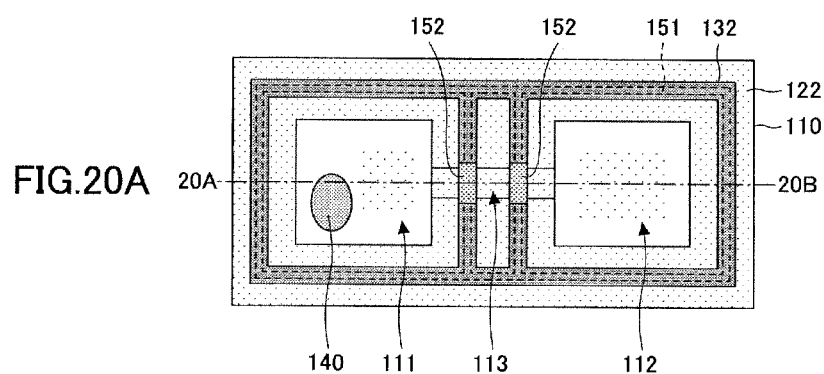
FIGS. 20A and 20B are fourth parts of the diagram for explaining the alkali metal cell fabricating method according to the second embodiment.
Figure 20B:
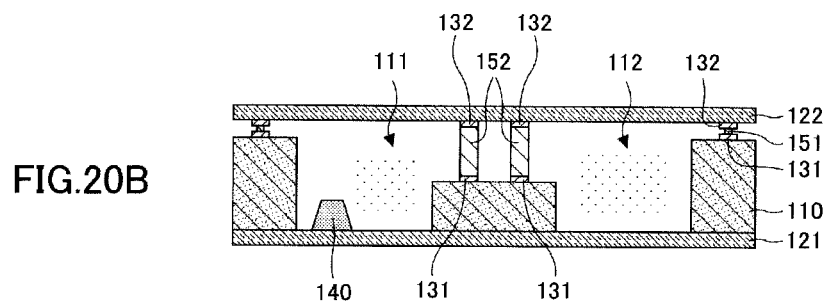

Next, as illustrated in FIGS. 20A and 20B, an alkali metal gas, etc., is produced by the compound 140 containing the alkali metal, after which the groove 113 is blocked by the second bonding metal layer 152 formed by the second bonding metal member 152a provided in the groove 113. More specifically, the second bonding metal member 152a which is provided in the groove 113 is heated to 280° C. or above, melted, and then cooled to form the second bonding metal layer 152, blocking the groove 113. In this way, a gap between the space in the first opening 111 and the space in the second opening 112 is blocked, so that they are spatially separated. Here the gap between the first opening 111 and the second opening 112 is blocked by two second bonding metal layers 152 in the groove 113. This process corresponds to the process illustrated in FIGS. 13A to 13C in the method of fabricating the alkali metal cell according to the first embodiment and may be formed by a fabricating method similar to the first embodiment. FIG. 20A is a top face view in this process, while FIG. 20B is a sectional view cut in a dot-dash line 20A-20B in FIG. 20A.

Figure 21A:
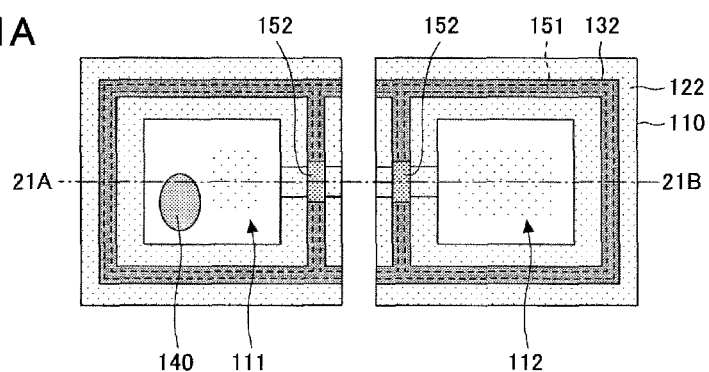
FIGS. 21A and 21B are fifth parts of the diagram for explaining the alkali metal cell fabricating method according to the second embodiment.
Figure 21B:
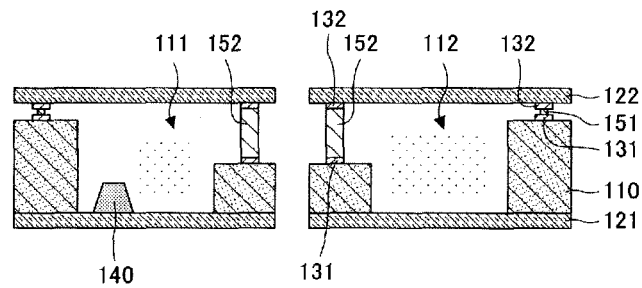

Next, as illustrated in FIGS. 21A and 21B, an area in which the first opening 111 is formed and an area in which the second opening 112 is formed are cut by dicing, etc., and separated. Here, cutting in between the two locations of the second bonding metal layer 152 by dicing causes a dicing blade to be not in contact with the second bonding metal layer 152, making it possible to provide the separation without making a hole, etc., in the second bonding metal layer 152 when dicing. This process corresponds to the process illustrated in FIGS. 14A and 14B in the alkali metal cell fabricating method according to the first embodiment and may be formed by a fabricating method similar to the first embodiment. FIG. 21A is a top face view in this process, while FIG. 21B is a sectional view cut in a dot-dash line 21A-21B in FIG. 21A.

Figure 22:
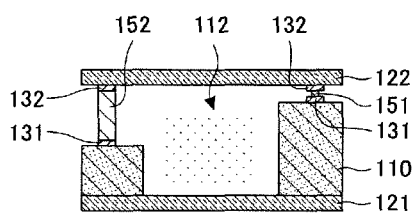
FIG. 22 is a sixth part of the diagram for explaining the alkali metal cell fabricating method according to the second embodiment.

The alkali metal cell according to the present embodiment that is fabricated in this way is illustrated in FIG. 22. In the alkali metal cell according to the present embodiment, the dicing blade does not come into contact with the second bonding metal layer 152 when cutting by dicing, making it possible to improve the yield rate when fabricating the alkali metal cell. Moreover, the ability to suppress leakage makes it possible to fabricate a highly reliable alkali metal cell.

Other features in the above embodiment are the same as those in the first embodiment.

Third Embodiment

Next, a third embodiment is described. In the method of fabricating the alkali metal cell according to the present embodiment, a compound 140 containing the alkali metal is provided in an opening which does not penetrate the Si substrate 110.

Figure 23A:
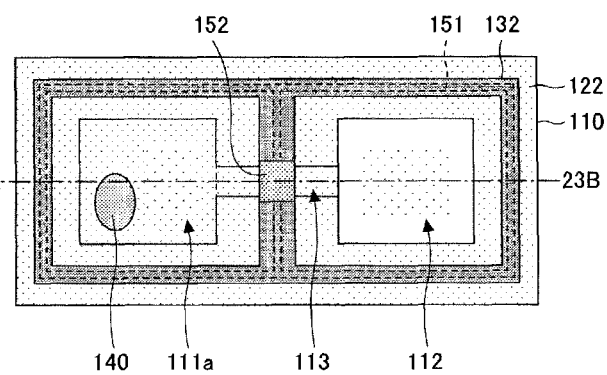
FIGS. 23A and 23B are diagrams for explaining the alkali metal cell fabricating method according to a third embodiment.
Figure 23B:
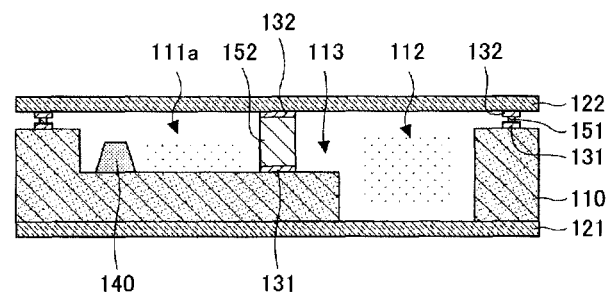

More specifically, as illustrated in FIGS. 23A and 23B, the second opening 112 which penetrates the Si substrate 110 and the first opening 111a and the groove 113 that do not penetrate the Si substrate 110 are formed. The first opening 111a may be formed in a process similar to the process of forming the groove 113 according to the fabricating method in the first embodiment. The process illustrated in FIGS. 23A and 23B corresponds to the process illustrated in FIGS. 13A to 13C in the alkali metal cell fabricating method according to the first embodiment and the cell may be formed by a fabricating method similar to the first embodiment. FIG. 23A is a top face view in this process, while FIG. 23B is a sectional view cut in a dot-dash line 23A-23B in FIG. 23A.

In this way, the first opening 111a which does not penetrate the Si substrate 110 is formed and the compound 140 containing the alkali metal is provided in the first opening 111a, making it possible to heat the compound 140 containing the alkali metal to a higher temperature. This causes the alkali metal gas such as Cs, etc., to be produced efficiently.

Other features in the above embodiment are the same as those in the first embodiment.

Fourth Embodiment

Next, a fourth embodiment is described. In the alkali metal cell fabricating method according to the present embodiment, a shape of a groove is different from a shape of the groove 113 according to the first embodiment.

Figure 24A:
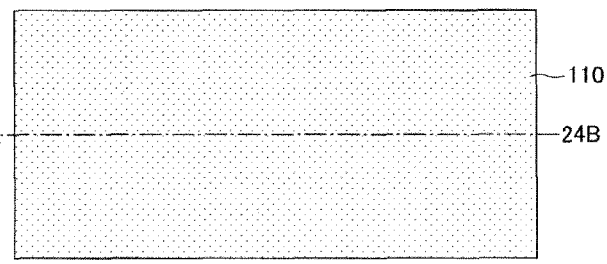
FIGS. 24A and 24B are first parts of the diagram for explaining the alkali metal cell fabricating method according to a fourth embodiment.
Figure 24B:
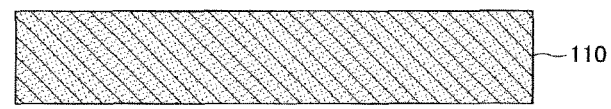

First, as illustrated in FIGS. 24A and 24B, an Si substrate 110 is prepared. This Si substrate 110 has a thickness of 1.5 mm and has both faces thereof mirror finished. This process corresponds to a process illustrated in FIGS. 2A and 2B in the alkali metal cell fabricating method according to the first embodiment. FIG. 24A is a top face view in this process, while FIG. 24B is a sectional view cut in a dot-dash line 24A-24B in FIG. 24A.

Figure 25A:
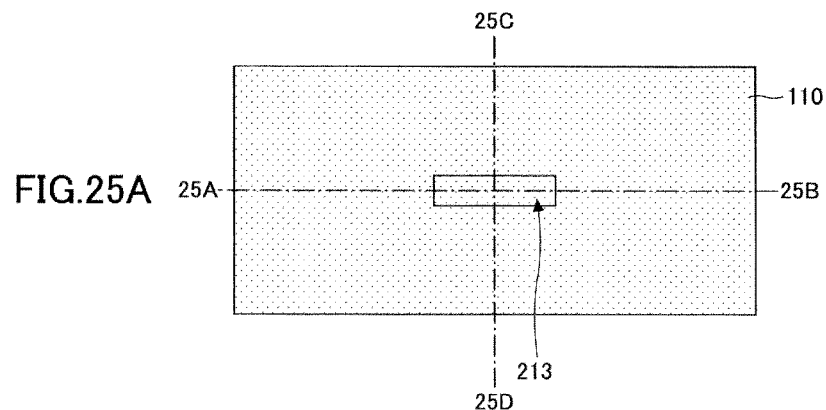
FIG. 25A to 25C are second parts of the diagram for explaining the alkali metal cell fabricating method according to the fourth embodiment.
Figure 25B:
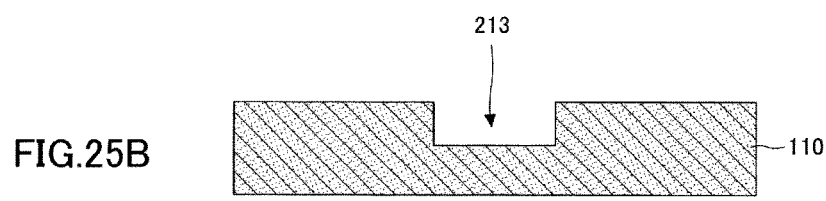
Figure 25C:
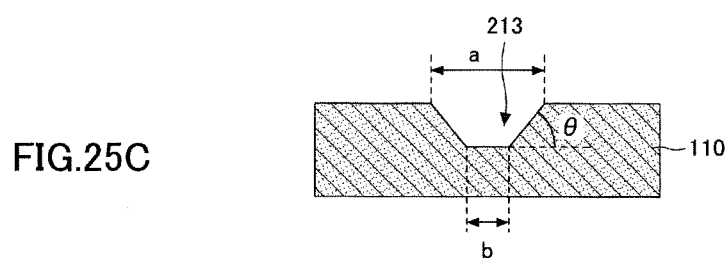

Next, as shown in FIGS. 25A-25C, an SiN film (not shown) is formed on both faces of the Si substrate 110 by low pressure CVD. Thereafter, a photo resist is coated on the SiN film formed on one face of the Si substrate 110, and exposed and developed by the aligner. In this way, a resist pattern (not shown) having an opening in an area in which the groove 213 is formed is formed on an SiN film on one face of the Si substrate 110. Thereafter, by conducting dry etching using $CF_4$ as an etching gas, the SiN film is removed in an area in which the resist pattern is not formed, and, moreover, the resist pattern (not shown) is removed.

Thereafter, by conducting wet etching using a KOH (30 wt %) solution at a temperature of 85° C., in the Si substrate 110, Si in the area in which the SiN film is not formed is removed, forming a groove 213. The formed groove 213 does not penetrate the Si substrate 110. Thereafter, the SiN film is removed by dry etching, or wet etching using a solution for removing SiN. With the wet etching of the Si substrate 110, which is anisotropic etching, a reverse slope of an inclination angle θ of 54.7°, or, in other words, a taper-shaped reverse slope is formed on a side face of the groove 213 formed. More specifically, the reverse slope of the inclination angle θ of 54.7° on a side face of the groove 213 is formed, so that the groove 213 having a relationship of a>b is formed, assuming a width on a surface side on one face of the Si substrate 110 of a and a width on a bottom face side of b. FIG. 25A is a top face view in this process, FIG. 25B is a sectional view cut in a dot-dash line 25A-25B in FIG. 25A, and FIG. 25C is a sectional view cut in a dot-dash line 25C-25D in FIG. 25A.

Figure 26A:
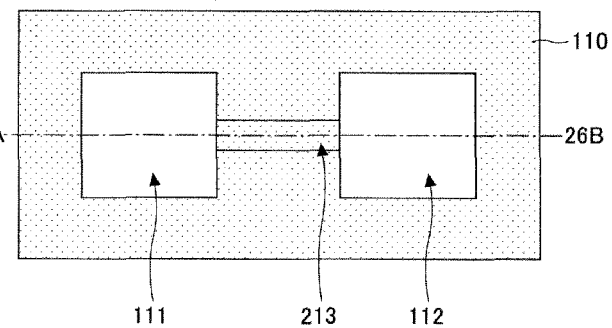
FIGS. 26A and 26B are third parts of the diagram for explaining the alkali metal cell fabricating method according to the fourth embodiment.
Figure 26B:
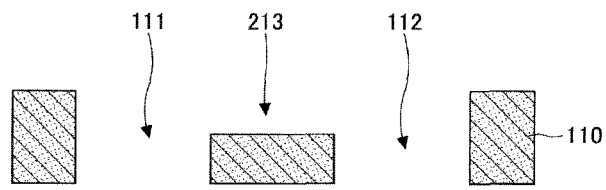

Next, as illustrated in FIGS. 26A and 26B, two openings, or, in other words, the first opening 111 and the second opening 112 are formed in the Si substrate 110. The first opening 111 and the second opening 112 that are formed in the Si substrate 110 penetrates the Si substrate 110, so that the first opening 111 and the second opening 112 are formed such that they are spatially connected by the groove 213.

More specifically, the photo resist is coated onto one face of the Si substrate 110 and exposed and developed by the aligner, thereby forming a resist pattern (not shown) which has an opening in an area in which the first opening 111 and the second opening 112 are formed. Thereafter, by dry etching such as ICP etching, etc., Si in an area in which the resist pattern is not formed is removed up to half a depth of a thickness of the Si substrate 110, forming a recess. In this way, on one face of the Si substrate 110, a part of the first opening 111 and the second opening 112 is formed.

Thereafter, the photo resist is coated onto the other face of the Si substrate 110 and exposed and developed by the aligner, thereby forming a resist pattern not shown) which has an opening in an area in which the first opening 111 and the second opening 112 are formed. Thereafter, by the dry etching such as the ICP etching, etc., Si in an area in which the resist pattern is not formed is removed and the first opening 111 and the second opening 112 are formed by penetrating the Si substrate 110. Dry etching in the Si substrate 110 is carried out by a Bosch process in which etching is conducted by alternately supplying $SF_6$ and $C_4F_8$. The Bosch process makes it possible to conduct highly anisotropic etching at high speed in the Si substrate 110. Power applied in this ICP etching is 2 kW.

This process corresponds to a process illustrated in FIGS. 3A and 3B in the alkali metal cell fabricating method in the first embodiment. FIG. 26A is a top face view in this process, while FIG. 26B is a sectional view cut in a dot-dash line 26A-26B in FIG. 26A.

Figure 27A:
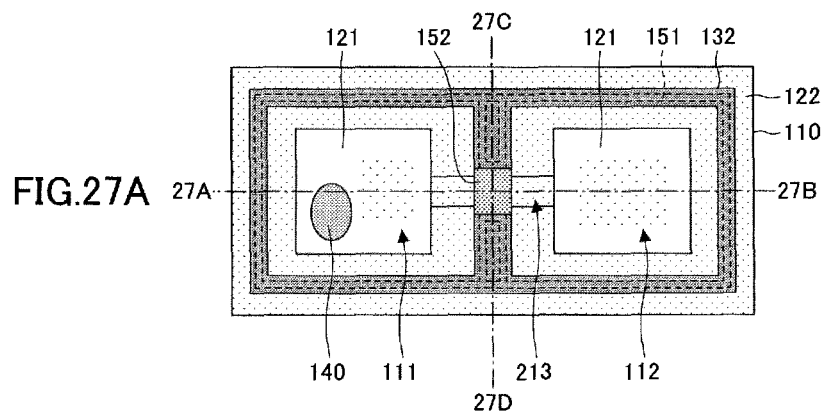
FIG. 27A to 27C are fourth parts of the diagram for explaining the alkali metal cell fabricating method according to the fourth embodiment.
Figure 27B:
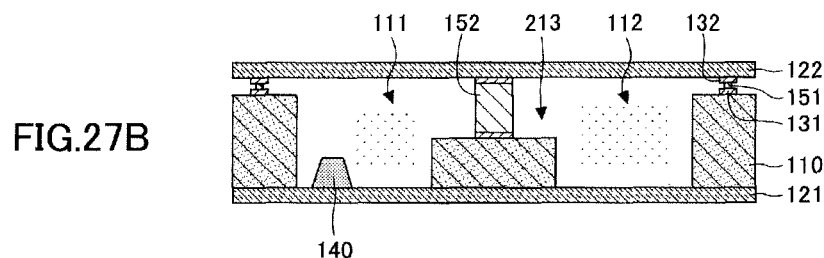
Figure 27C:
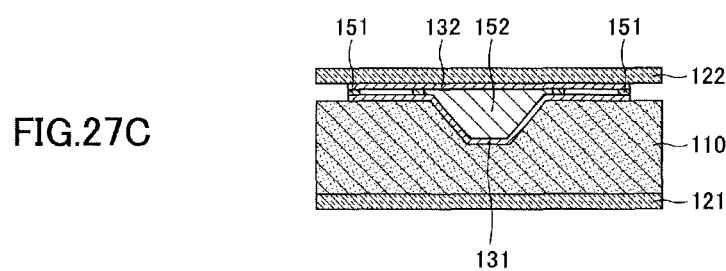

Next, as shown in FIGS. 27A to 27C, the first glass substrate 121 is bonded to the other face of the Si substrate 110, a first bonding metal member is formed on one face of the Si substrate 110, and a second bonding metal member is provided in the groove 213. Thereafter, the first bonding metal layer 151 is formed by applying the first bonding metal member, and the second glass substrate 122 is bonded to one face of the Si substrate 110. Thereafter, the alkali metal gas is produced from the compound 140 containing the alkali metal, and heated until the second bonding metal member melts, after which it is cooled, thereby forming the second bonding metal layer 152 by the second bonding metal member, blocking the groove 213. This process corresponds to the process illustrated in FIGS. 13A to 13C in the alkali metal cell fabricating method according to the first embodiment and the cell may be formed by a fabricating method similar to the first embodiment. FIG. 27A is a top face view in this process. FIG. 27B is a sectional view cut in a dot-dash line 27A-27B in FIG. 27A. FIG. 27C is a sectional view cut in a dot-dash line 27C-27D in FIG. 27A.

Figure 28A:
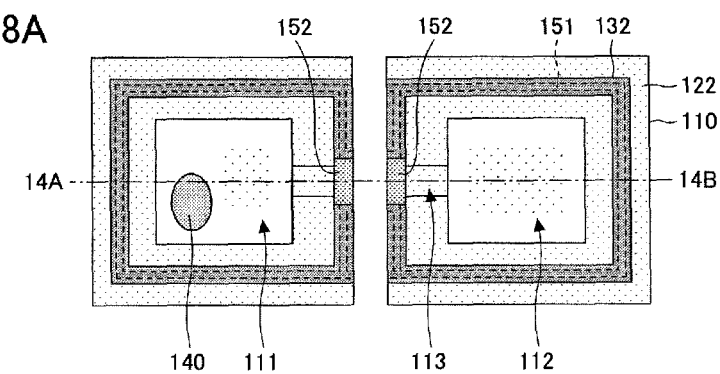
FIGS. 28A and 28B are fifth parts of the diagram for explaining the alkali metal cell fabricating method according to the fourth embodiment.
Figure 28B:
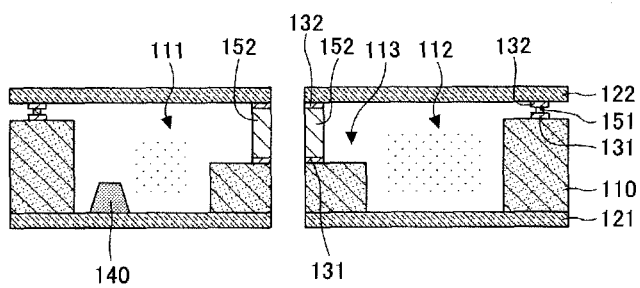

Next, as illustrated in FIGS. 28A and 28B, an area in which the first opening 111 is formed and an area in which the second opening 112 is formed are cut by dicing, etc., and separated. This process corresponds to the process illustrated in FIGS. 14A and 14B in the alkali metal cell fabricating method according to the first embodiment and the cell may be formed by a fabricating method similar to the first embodiment. FIG. 28A is a top face view in this process, while FIG. 28B is a sectional view cut in a dot-dash line 14A-14B in FIG. 28A.

The above-described process makes it possible to fabricate the alkali metal cell according to the present embodiment. The alkali metal cell in the present embodiment that is fabricated in this way is the same as the alkali metal cell according to the first embodiment.

In the alkali metal cell fabricating method according to the present embodiment, a side face of the groove 213 is formed in a taper shape, making possible to form the bonding part metal film 131 without a gap, thereby making it possible to further ensure bonding by the second bonding metal member 152a. For example, if the side face of the groove is formed generally vertically as opposed to being formed in a taper shape, even when the bonding part metal film 131 is formed by sputtering, or vacuum deposition, the bonding part metal film 131 may not be formed on a side face of the groove. In this case, the melted second bonding metal member 152a does not wet spread sufficiently on the side face of the groove, causing the groove not to be blocked completely, possibly causing a gap to be created. However, according to the present embodiment, the side face of the groove 213 is formed in a taper shape, making it possible to form the bonding part metal film 131 on the side face of the groove 213 even when the bonding part metal film 131 is formed by sputtering, vacuum deposition, etc. In this way, the groove 213 may be more completely blocked without a gap by the melted second bonding metal member 152a.

Other features in the above embodiment are the same as those in the first embodiment.

Fifth Embodiment

The alkali metal cell and the alkali metal cell fabricating method according to a fifth embodiment are described based on FIGS. 29A to 48B.

Figure 29A:
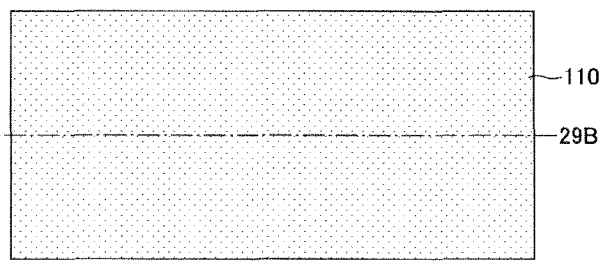
FIGS. 29A and 29B are first parts of the process chart of the alkali metal cell fabricating method according to a fifth embodiment.
Figure 29B:
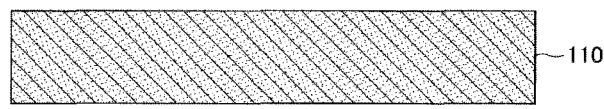

First, as illustrated in FIGS. 29A and 29B, an Si (silicon) substrate 110 is prepared. This Si substrate 110 has a thickness of 1.5 mm and has both faces thereof mirror-finished. FIG. 29A is a top face view in this process, while FIG. 29B is a sectional view cut in a dot-dash line 29A-29B in FIG. 29A.

Next, as illustrated in FIGS. 30A and 30B, two openings, or, in other words, the first opening 111 and the second opening 112 are formed in the Si substrate 110. The first opening 111 and the second opening 112 that are formed in the Si substrate 110 penetrate the Si substrate 110. In the present embodiment, the first opening 111 may be referred to as one opening, while the second opening 112 may be referred to as the other opening. FIG. 30A is a top face view in this process, while FIG. 30B is a sectional view cut in a dot-dash line 30A-30B in FIG. 30A.

More specifically, the photo resist is coated onto one face of the Si substrate 110 and exposed and developed by the aligner, thereby forming a resist pattern (not shown) which has an opening in an area in which the first opening 111 and the second opening 112 are formed. Thereafter, by dry etching such as ICP (inductively coupled plasma) etching, etc., Si in an area in which the resist pattern is not formed is removed up to half a depth of a thickness of the Si substrate 110, forming a recess. In this way, on one face of the Si substrate 110, a part of the first opening 111 and the second opening 112 is formed.

Thereafter, the photo resist is coated onto the other face of the Si substrate 110 and exposed and developed by the aligner, thereby forming a resist pattern (not shown) which has an opening in an area in which the first opening 111 and the second opening 112 are formed. Thereafter, by the dry etching such as the ICP etching, etc., Si in an area in which the resist pattern is not formed is removed and the first opening 111 and the second opening 112 are formed by penetrating the Si substrate 110. Dry etching in the Si substrate 110 is carried out by a Bosch process in which etching is conducted by alternately supplying $SF_6$ and $C_4F_8$. The Bosch process makes it possible to conduct highly anisotropic etching at high speed in the Si substrate 110. Power applied in this ICP etching is 2 kW.

Moreover, other than the above-described drying etching, the first opening 111 and the second opening 112 can also be formed by wet etching. More specifically, an SiN film (not shown) is formed on both faces of the Si substrate 110 by low pressure CVD (chemical vapor deposition). Thereafter, a photo resist is coated on the formed SiN film, and exposed and developed by the aligner. In this way, on both faces of the Si substrate 110, a resist pattern (not shown) is formed which has an opening in an area in which are formed the first opening 111 and the second opening 112.

Thereafter, by conducting dry etching using $CF_4$ as an etching gas, the SiN film is removed in an area in which the resist pattern is not formed, and, moreover, the resist pattern (not shown) is removed. Thereafter, by conducting wet etching using a KOH (30 wt %) solution at a temperature of 85° C., in the Si substrate 110, Si in the area in which the SiN film is not formed is removed, forming the first opening 111 and the second opening 112. Here, the first opening 111 and the second opening 112 are formed by removing material from both faces of the one face and the other face of the Si substrate 110, making it possible to penetrate the Si substrate 110. Thereafter, the SiN film is removed by dry etching, or wet etching using a solution for removing SiN. The wet etching of the Si substrate 110 that is conducted here is anisotropic etching, possibly causing a reverse slope of an inclination angle of 54.7° to be formed on a side face of the first opening 111 and the second opening 112 formed.

Figure 31A:
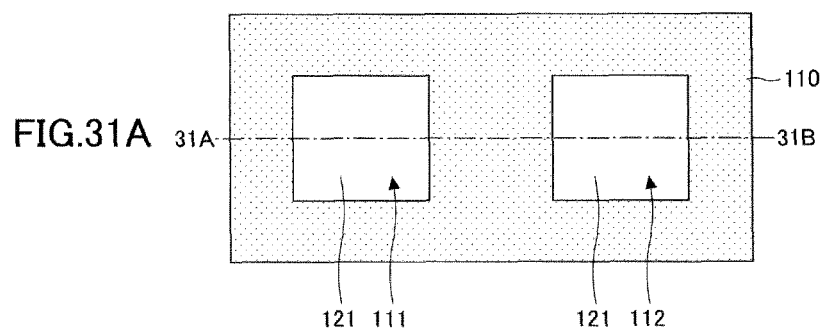
FIGS. 31A and 31B are third parts of the process chart of the alkali metal cell fabricating method according to the fifth embodiment.
Figure 31B:
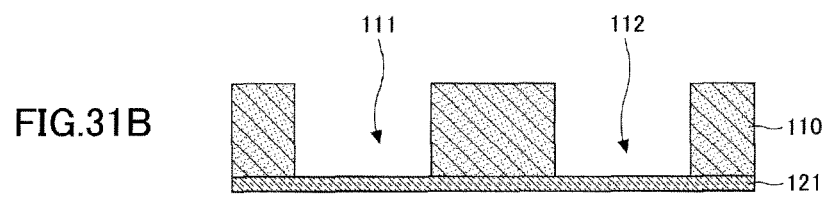

Next, as illustrated in FIGS. 31A and 31B, a first glass 121, which is a first transparent substrate, is anodically bonded to the other face of the Si substrate 110. More specifically, in a low pressure chamber, the first glass substrate 121 is made to contact the other face of the Si substrate 110 and is anodically bonded thereto by applying −800 V to the first glass substrate 121 at 380° C. In this way, the other face side of the first opening 111 and the second opening 112 that are formed in the Si substrate 110 is blocked by the first glass substrate 121. In this process, since an alkali metal material, etc., are not yet provided, the alkali metal is not oxidized due to oxygen, etc., produced by the anodic bonding. While a case of anodic bonding is explained in the above, the other face of the Si substrate 110 and the first glass substrate 121 may be bonded by direct bonding rather than by the anodic bonding. FIG. 31A is a top face view in this process, while FIG. 31B is a sectional view cut in a dot-dash line 31A-31B in FIG. 31A.

Figure 32A:
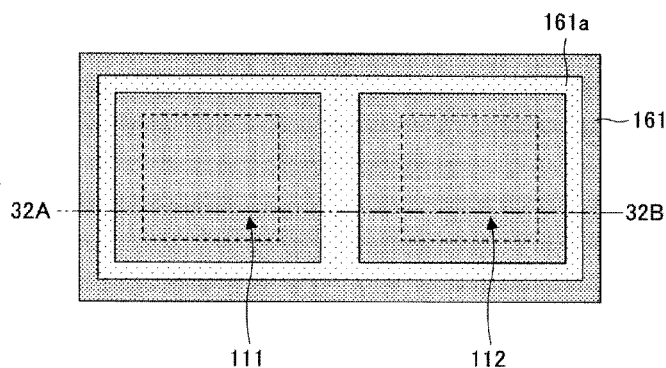
FIGS. 32A and 32B are fourth parts of the process chart of the alkali metal cell fabricating method according to the fifth embodiment.
Figure 32B:
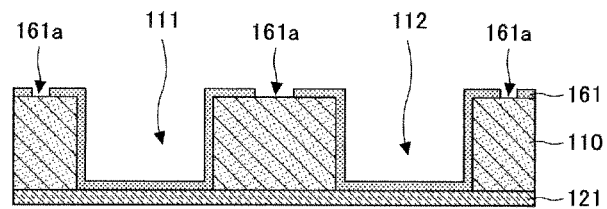

Next, as illustrated in FIGS. 32A-32B, a resist pattern 161 having an opening 161a in an area in which a below-described bonding part metal film is formed is formed on one face of the Si substrate 110. More specifically, a photo resist is coated onto the one face of the Si substrate 110 and exposed and developed by the aligner, so that the resist pattern 161 having the opening 161a is formed. When the resist pattern is formed, the photo resist is coated without omission along a wall face inside the first opening 111 and the second opening 112 that are formed in the Si substrate 110, so that spray coating for spraying liquid in which the photo resist and gas are mixed may be used. FIG. 32A is a top face view in this process, while FIG. 32B is a sectional view cut in a dot-dash line 32A-32B in FIG. 32A.

Figure 33A:
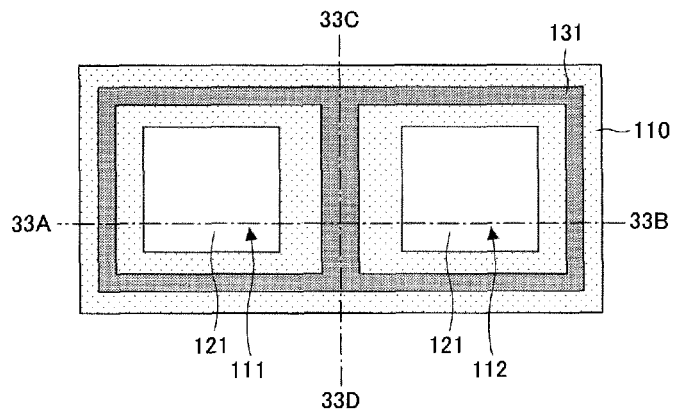
FIGS. 33A to 33C are fifth parts of the process chart of the alkali metal cell fabricating method according to the fifth embodiment.
Figure 33B:
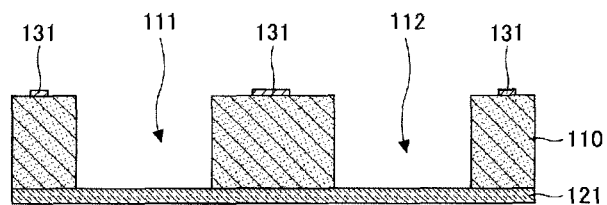
Figure 33C:
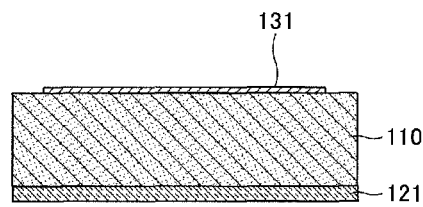

Next, as shown in FIGS. 33A-33C, a bonding part metal film 131 is formed on one face of the Si substrate 110. More specifically, a metal laminated film containing Au: 700 nm/Cr: 10 nm is formed by sputtering, vacuum deposition, etc., on a face on which the resist pattern 161 is formed. Thereafter, by soaking in an organic solvent, etc., the metal laminated film formed on the resist pattern 161 is removed by a lift-off with the resist pattern 161, so that the bonding part metal film 131 is formed by a remaining metal laminated film. FIG. 33A is a top face view in this process. FIG. 33B is a sectional view cut in a dot-dash line 33A-33B in FIG. 33A. FIG. 33C is a sectional view cut in a dot-dash line 33C-33D in FIG. 33A.

Figure 34A:
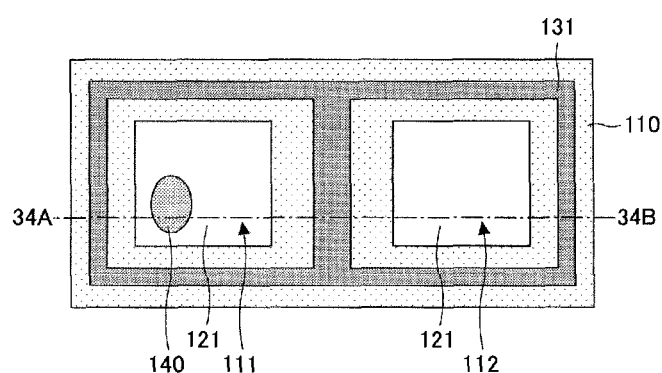
FIGS. 34A and 34B are sixth parts of the process chart of the alkali metal cell fabricating method according to the fifth embodiment.
Figure 34B:
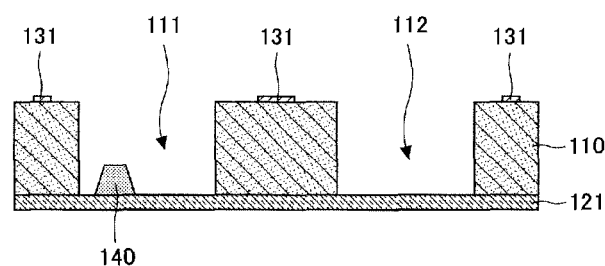

Next, as shown in FIGS. 34A and 34B, a Cs dispenser which is a compound 140 containing an alkali metal such as Cs, Rb, etc., is provided on the first glass substrate 121, etc., in the first opening 111 formed in the Si substrate 110. In the present embodiment, such an area formed by the first opening 111 in which the compound 140 containing the alkali metal is provided may be described as a raw material chamber. FIG. 34A is a top face view in this process, while FIG. 34B is a sectional view cut in a dot-dash line 34A-34B in FIG. 34A.

Figure 35A:
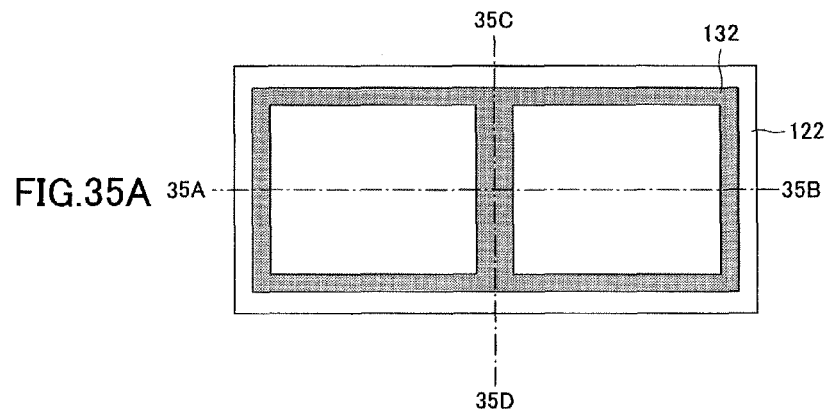
FIGS. 35A to 35C are seventh parts of the process chart of the alkali metal cell fabricating method according to the fifth embodiment.
Figure 35B:
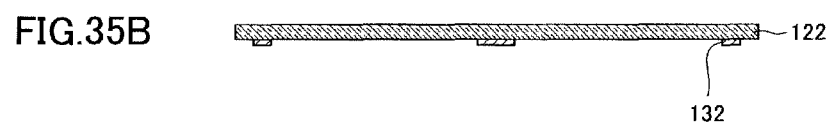
Figure 35C:
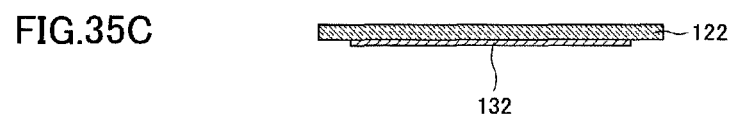

Next, as illustrated in FIGS. 35A to 35C, a second glass substrate 122 which is a second transparent substrate is prepared and the bonding part metal film 132 is formed on one face of the second glass substrate 122. More specifically, a photo resist is coated onto the one face of the second glass substrate 122 and exposed and developed by an aligner, so that a resist pattern (not shown) is formed which has an opening in an area in which the bonding part metal film 132 is formed. Thereafter, a metal laminated film containing Au: 700 nm/Cr: 10 nm is formed by sputtering, vacuum deposition, etc., on a face on which the resist pattern is formed. Thereafter, by soaking into an organic solvent, etc., the metal laminated film formed on the resist pattern is removed by a lift-off with the resist pattern, so that the bonding part metal film 132 is formed by a metal laminated film remaining on one face of the second glass substrate 122. The bonding part metal film 132 formed in this way is formed at such a position as to oppose the bonding part metal film 131 formed on one face of the Si substrate 110. FIG. 35A is a top face view in this process. FIG. 35B is a sectional view cut in a dot-dash line 35A-35B in FIG. 35A. FIG. 35C is a sectional view cut in a dot-dash line 35C-35D in FIG. 35A.

Figure 36A:
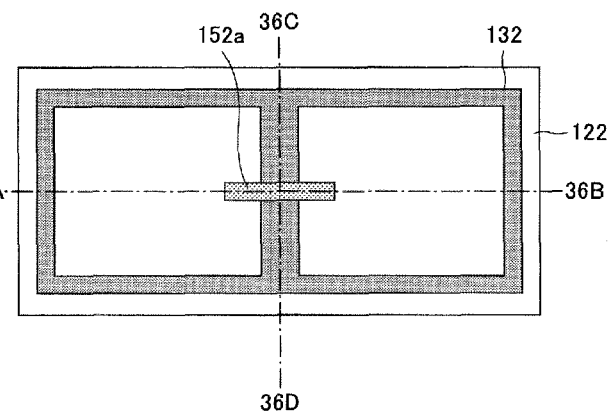
FIGS. 36A to 36C are eighth parts of the process chart of the alkali metal cell fabricating method according to the fifth embodiment.
Figure 36B:
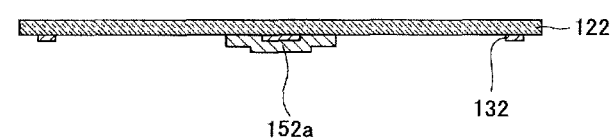
Figure 36C:
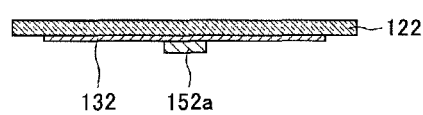

Next, as shown in FIGS. 36A-36C, a second bonding metal member 152a formed by a second bonding metal is provided in a part of the groove 132. The second bonding metal, which is an alloy of Au and Sn, is formed in a shape of a thin film with a thickness of 5 µm. In the present embodiment, the second bonding metal which forms the second bonding metal member 152a is an alloy of Au: 80% and Sn: 20% and the melting temperature is 280° C. As shown in FIG. 36B, the second bonding metal member 152a is provided so as to traverse the bonding part metal film 132, and is provided not only on the bonding part metal film 132, but also continuously on the second glass substrate 122. FIG. 36A is a top face view in this process; FIG. 36B is a sectional view cut in a dot-dash line 36A-36B in FIG. 36A; and FIG. 36C is a sectional view cut in a dot-dash line 36C-36D in FIG. 36A.

Figure 37A:
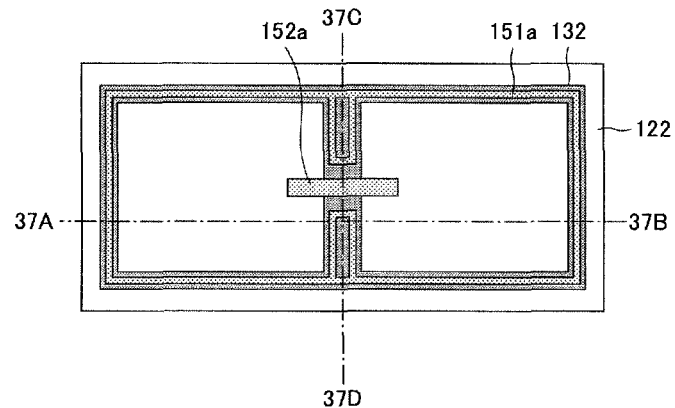
FIGS. 37A to 37C are ninth parts of the process chart of the alkali metal cell fabricating method according to the fifth embodiment.
Figure 37B:
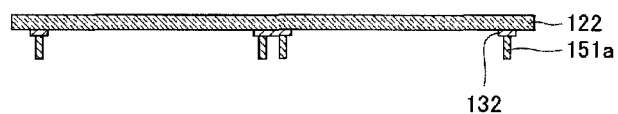
Figure 37C:
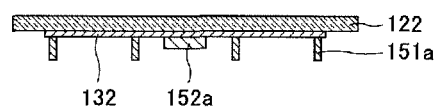

Next, as shown in FIGS. 37A to 37C, a first bonding metal member 151a which is formed by metal fine particles being a first bonding metal is formed on the bonding part metal film 132 of the second glass substrate 122. The first bonding metal member 151a may be described as a metal fine particle layer since it is formed by the metal fine particles. In the present embodiment, the metal fine particles which form the first bonding metal member 151a are fine particles of Au with a particle diameter of between 0.05 µm and 1 µm and are formed on the bonding part metal film 132 of the second glass substrate 122 by screen printing with a cured resist as a mask. As described below, in order to bond at a low temperature of approximately 200° C. by the first bonding metal member 151a, it is preferable that the particle diameter of the metal fine particles which form the first bonding metal member 151a is between 0.05 µm and 1 µm. The first bonding metal member 151a formed in this way has a width of approximately 20 µm and a thickness of approximately 20 µm. FIG. 37A is a top face view in this process. FIG. 37B is a sectional view cut in a dot-dash line 37A-37B in FIG. 37A. FIG. 37C is a sectional view cut in a dot-dash line 37C-37D in FIG. 37A.

Figure 38A:
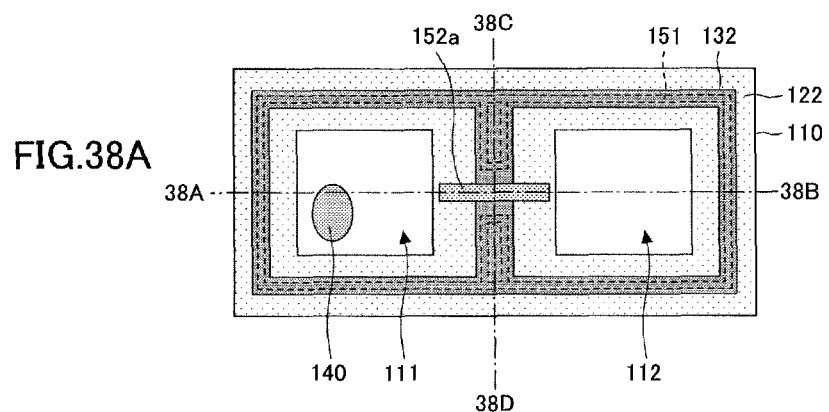
FIGS. 38A to 38C are tenth parts of the process chart of the alkali metal cell fabricating method according to the fifth embodiment.
Figure 38B:
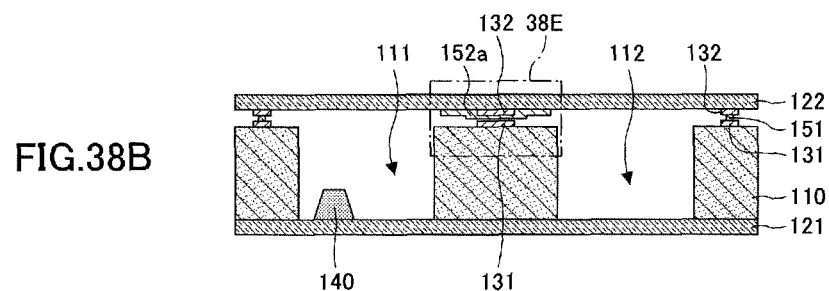
Figure 38C:
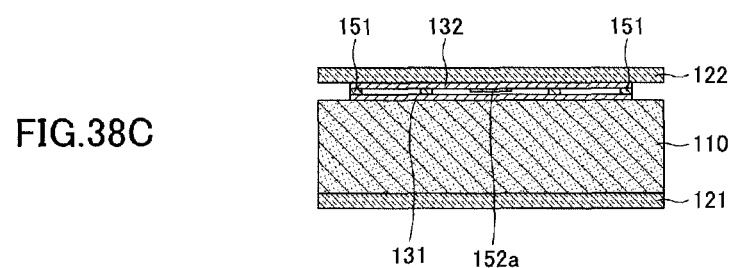
Figure 39:
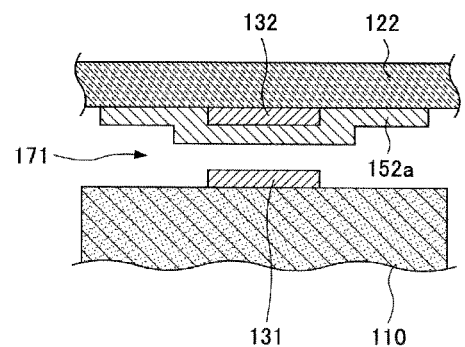
FIG. 39 is a main part enlarged view of FIG. 38B.

Next, as shown in FIGS. 38A to 38C and FIG. 39, the one face of the Si substrate 110 and the one face of the second glass substrate 122 are bonded by the first bonding metal layer 151 which is formed by the first bonding metal member 151a. FIG. 38A is a top face view in this process. FIG. 38B is a sectional view cut in a dot-dash line 38A-38B in FIG. 38A. FIG. 38C is a sectional view cut in a dot-dash line 38C-38D in FIG. 38A. Moreover, FIG. 39 is an enlarged view of an area surrounded by a dot-dash line 38E in FIG. 38B.

More specifically, in a vacuum chamber into which nitrogen gas to be a buffer gas is introduced to produce the nitrogen atmosphere, the bonding part metal film 131 which is formed on one face of the Si substrate 110 is made to be in contact with the first bonding metal member 151a which is formed on one face of the second glass substrate 122. Thereafter, at an increased temperature of approximately 200° C., pressurizing at 100 MPa is conducted for 30 minutes. This causes the one face of the Si substrate 110 and the one face of the second glass substrate 122 to be bonded by the first bonding metal layer 151 which is formed by application by the first bonding metal member 151a. In this way, the one face side of the first opening 111 and the second opening 112 in the Si substrate 110 has the second glass substrate 122 bonded by the first bonding metal layer 151 and is blocked by the second glass substrate 122. In this way, an enclosed space including the first opening 111 and the second opening 112 is formed. Here, the first bonding metal layer 151 has a height of approximately 10 µm after bonding. Therefore, in an area not bonded by the first bonding metal layer 151 between the first opening 111 and the second opening 112, a gap 171 with a height of approximately 10 µm is formed. Moreover, a second bonding metal member 152a has a thickness of approximately 5 µm, which is smaller than the height of the gap 171, so that the space in the first opening 111 and the space in the second opening 112 are maintained to be spatially connected via the gap 171.

In such a bonding method using the metal fine particles, gas such as oxygen, etc., is not produced at the time of bonding, so that impurities such as oxygen, etc., do not enter the first opening 111 in which the compound 140 containing the alkali metal is placed. Moreover, once applied, Au fine particles which are metal fine particles do not melt unless they are heated to the melting point (approximately 1000° C.) of Au. Thus, even when they are reheated to a bonding temperature (approximately 200° C.) or above in the metal fine particle layer which is the first bonding metal member 151a, a portion bonded by the first bonding metal layer 151 does not melt as long as the temperature is less than or equal to 1000° C. Thus, even when reheated to the bonding temperature or above, gas inside the first opening 111 and the second opening 112 does not leak out at less than or equal to approximately 1000° C.

At this bonding temperature (approximately 200° C.), the melting temperature of the second bonding metal forming the second bonding metal member 152a is 280° C., so that the second bonding metal member 152a does not melt. Moreover, the height of the second bonding metal member 152a is smaller than the height of the first bonding metal layer 151, so that there is the gap 171 around the second bonding metal member 152a even after the bonding. Therefore, even when the second bonding metal member 152a is provided, it is maintained in this process that a space in the first opening 111 and a space in the second opening 112 are spatially connected via the gap 171.

Figure 40A:
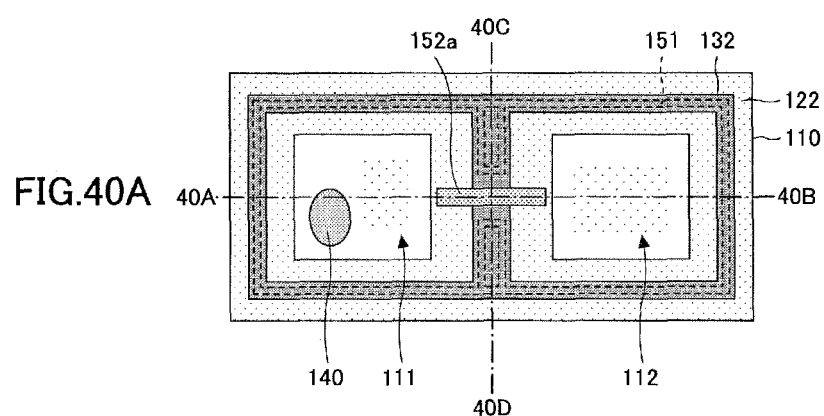
FIGS. 40A and 40B are eleventh parts of the process chart of the alkali metal cell fabricating method according to the fifth embodiment.
Figure 40B:
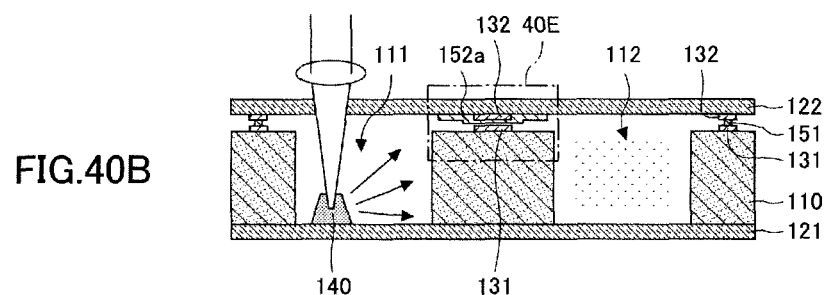
Figure 41:
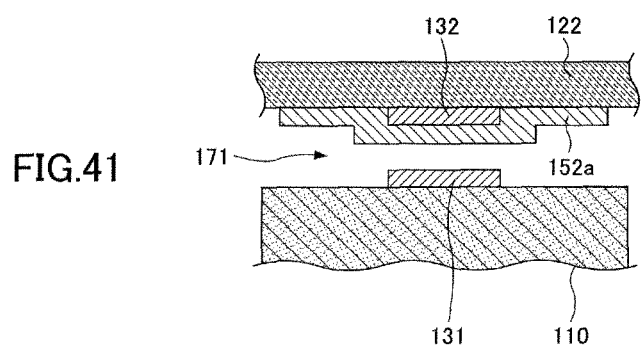
FIG. 41 is a main part enlarged view of FIG. 40B.

Next, as illustrated in FIGS. 40A, 40B, and 41, an alkali metal gas is produced by the compound 140 containing an alkali metal that is provided in the first opening 111. FIG. 40A is a top face view in this process, while FIG. 40B is a sectional view cut in a dot-dash line 40A-40B in FIG. 40A. Moreover, FIG. 41 is an enlarged view of an area surrounded by a dot-dash line 40E in FIG. 40B.

More specifically, when using a Cs dispenser, which is stable in the atmosphere, as the compound 140 containing the alkali metal, a laser light is irradiated onto the Cs dispenser which is provided in the first opening 111 to heat, causing Cs gas (an alkali metal gas) to be produced. Heating is conducted by collecting the irradiated laser light onto the compound 140 containing the alkali metal, so that the second bonding metal member 152a which is formed by the second bonding metal with a melting temperature of 280° C. does not melt. The melting point of Cs contained in the Cs dispenser, which is the compound 140 containing the alkali metal, is approximately 28° C. The compound 140 containing the alkali metal is irradiated by the laser light and heated to at least the melting temperature, causing Cs to be liquid and gas. Cs, which became gas, etc., passes through the gap 171 and enters the second opening 112. In addition to the above-described method of producing the alkali metal gas by irradiating the laser light onto the compound 140 containing the alkali metal, the alkali metal gas may be produced by directly heating the compound 140 containing the alkali metal or irradiating an ultraviolet light (UV light).

Figure 42A:
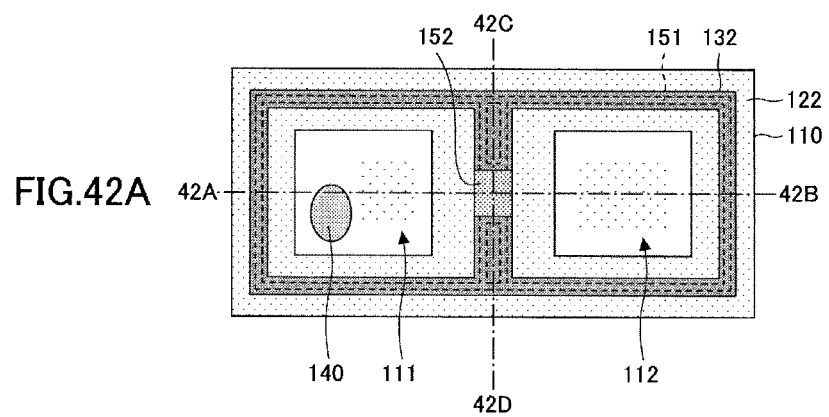
FIGS. 42A to 42C are twelfth parts of the process chart of the alkali metal cell fabricating method according to the fifth embodiment.
Figure 42B:
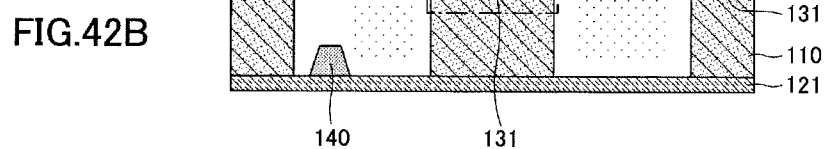
Figure 42C:
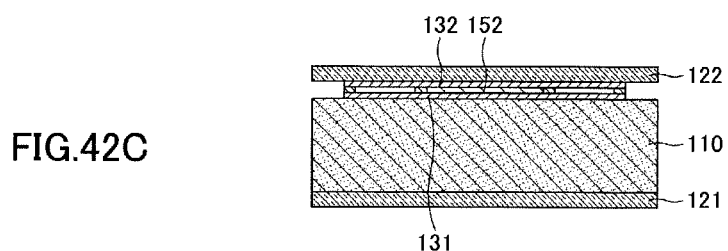
Figure 43:
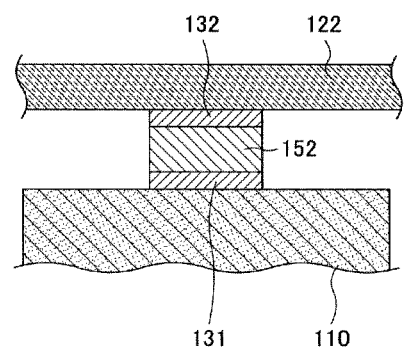
FIG. 43 is a main part enlarged view of FIG. 42B.

Next, as shown in FIGS. 42A to 42C and FIG. 43, the second bonding metal member 152a provided near the gap 171 that connects the first opening 111 and the second opening 112 is heated to 280° C. or above and melted, after which it is cooled. This causes the second bonding metal layer 152 to be formed, blocking the gap 171. In this way, a gap between the space in the first opening 111 and the space in the second opening 112 is blocked, so that they are spatially separated. An AuSn (with a weight ratio of Au:Sn=80:20) alloy, which is a second bonding metal forming the second bonding metal member 152a, is a type of brazing material with superior wettability. Therefore, when the AuSn alloy (with the weight ratio of Au:Sn=80:20), which is the second bonding metal, is heated to turn to liquid, it becomes easy to wet spread to the bonding part metal films 131 and 132 which are formed by a metal material. Thus, cooling after heating to 280° C. or above may cause the gap 171 which connects the first opening 111 and the second opening 112 to be easily blocked by the second bonding metal layer 152 formed by the second bonding metal member 152a. Then, when the heating temperature is less than or equal to approximately 1000° C., the first bonding metal layer 151 does not melt, so that, in this process, the alkali metal gas does not leak out of a hole, etc., being made in the first bonding metal layer 151. FIG. 42A is a top face view in this process. FIG. 42B is a sectional view cut in a dot-dash line 42A-42B in FIG. 42A. FIG. 42C is a sectional view cut in a dot-dash line 42C-42D in FIG. 42A. Moreover, FIG. 43 is an expanded view of an area surrounded by a dot-dash line 42E in FIG. 42B.

While a case of using the AuSn alloy (with the weight ratio of Au:Sn=80:20) as the second bonding metal has been described in the present embodiment, AuGe (with the weight ratio of Au:Ge=87.5:12.5), AuSi (with the weight ratio of Au:Si=96.8:3.2), etc., may be used. The melting temperature of AuGe (with the weight ratio of Au:Ge=87.5:12.5) is 361° C., while the melting temperature of AuSi (with the weight ratio of Au:Si=96.8:3.2) is 363° C. In the present embodiment, it suffices that the melting temperature of the second bonding metal is higher than the bonding temperature of the first bonding metal and lower than the melting point of the first bonding metal layer 151 formed by the first bonding metal bonding.

Figure 44A:
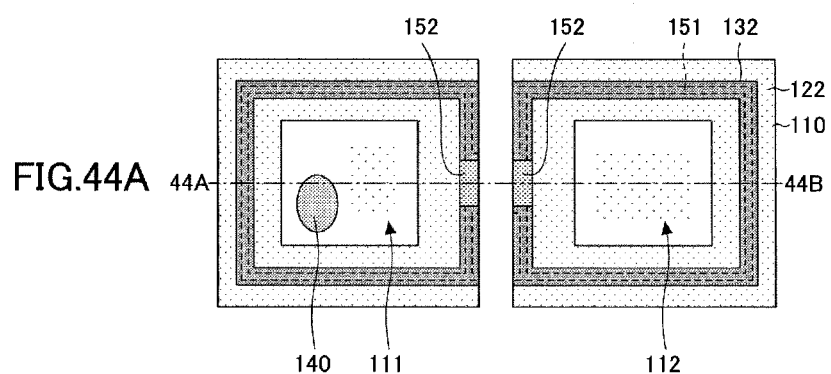
FIGS. 44A and 44B are thirteenth parts of the process chart of the alkali metal cell fabricating method according to the fifth embodiment.
Figure 44B:
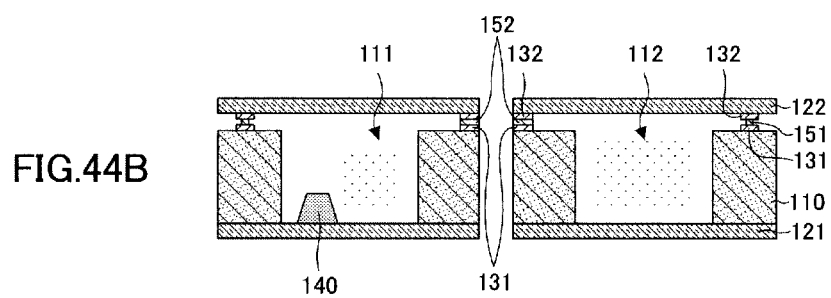

Next, as illustrated in FIGS. 44A and 44B, an area in which the first opening 111 is formed and an area in which the second opening 112 is formed are cut by dicing, etc., and separated. FIG. 44A is a top face view in this process, while FIG. 44B is a sectional view cut in a dot-dash line 44A-44B in FIG. 44A.

With the area in which the second opening 112 is formed that is separated in this way, the alkali metal cell according to the present embodiment is formed. The alkali metal cell fabricated in such a process has a small amount of impurities such as oxygen, etc., contained in the cell inner part being the second opening 112, yielding a highly reliable and stable atomic oscillator when used in an atomic oscillator.

Moreover, when there remains, within the alkali metal cell, the compound 140 containing the alkali metal after releasing the alkali metal, for example, it may adsorb gas inside the alkali metal cell, causing pressure within the alkali metal cell to change and reliability to decrease in this case. However, the compound 140 containing the alkali metal after releasing the alkali metal is not contained within the alkali metal cell in the present embodiment, making it possible to keep the pressure in the cell inner part that is the second opening 112 constant over a long term.

Figure 45A:
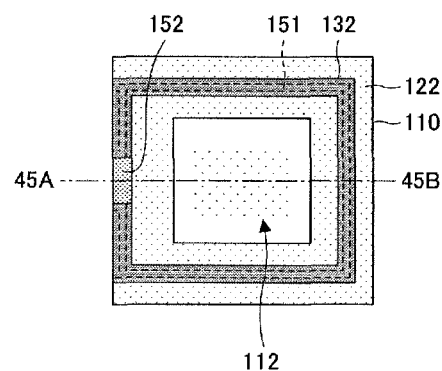
FIGS. 45A and 45B are structural diagrams of the alkali metal cell according to the fifth embodiment.
Figure 45B:
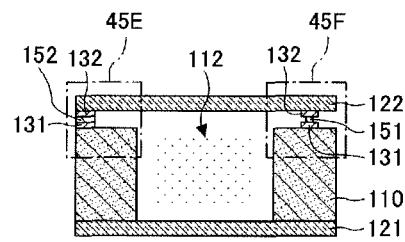
Figure 46A:
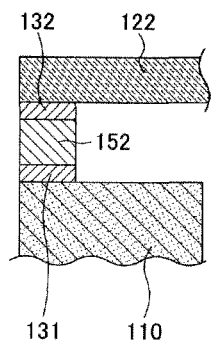
FIGS. 46A and 46B are main part enlarged views of FIG. 43B.
Figure 46B:
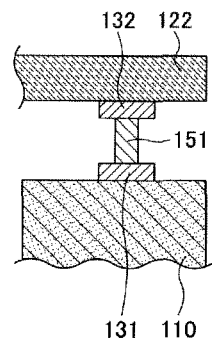

FIGS. 45A and 45B illustrate an alkali metal cell according to the present embodiment. FIG. 45A is a top face view in this process, while FIG. 45B is a sectional view cut in a dot-dash line 45A-45B in FIG. 45A. Moreover, FIG. 46A is an expanded view of an area surrounded by a dot-dash line 45E in FIG. 45B, while FIG. 46B is an expanded view of an area surrounded by a dot-dash line 45F in FIG. 45B.

The alkali metal cell according to the present embodiment has the cell inner part being formed by the second opening 112, while the first glass substrate 121 is bonded to the other face of the Si substrate 110 by anodic bonding. Moreover, the first bonding metal layer 151 formed by the first bonding metal member 151a and the second bonding metal layer 152 having the second glass substrate 122 formed by the second bonding metal member 152a are bonded to the one face of the Si substrate 110. Here, the temperature of bonding by the first bonding metal member 151a for forming the first bonding metal layer 151 is 200° C., while the temperature of bonding by the second bonding metal member 152a for forming the second bonding metal layer 152 is 280° C. Thus, the bonding temperature by the second bonding metal member 152a is higher than the bonding temperature by the first bonding metal member 151a. Moreover, the melting point of the first bonding metal layer 151 formed by the first bonding metal member 151a is approximately 1000° C., while the bonding temperature by the second bonding metal member 152a is a temperature which is lower than the melting temperature of the first bonding metal layer 151.

Furthermore, as described above, when the compound 140 containing the alkali metal cell is sealed in the cell inner part formed by the first opening 111, it is preferable to seal with a buffer gas such as nitrogen, etc., rather than within a vacuum. Colliding of an alkali metal atom to a cell inner wall causes an internal state of the alkali metal atom to change, causing frequency stability to decrease when used in the atomic oscillator. Thus, sealing the buffer gas such as nitrogen, etc., in the cell inner part makes it possible to decrease the probability of collision of the alkali metal atom to the cell inner wall and to suppress a decrease in the frequency stability. As the buffer gas, an inert gas is preferable, including nitrogen, neon, argon, a mixed gas of neon and argon, etc.

Figure 47A:
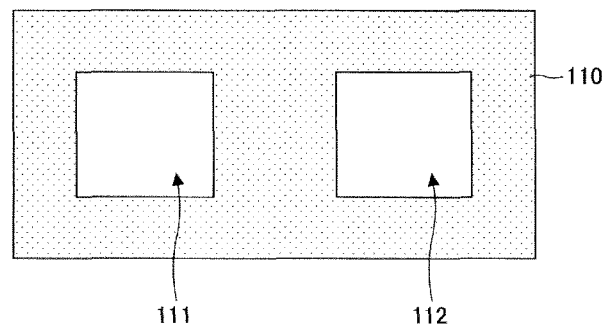
FIGS. 47A to 47C are first parts of the diagram for explaining the alkali metal cell fabricating method according to the fifth embodiment.

As illustrated in FIG. 47A, in the present embodiment, a groove is not formed in the Si substrate 110, so that a volume of space sealed is small. While it is necessary to conduct melting so that the whole groove is filled up when there is the groove as in the first embodiment, it suffices to fill up a gap of 10 μm in the present embodiment. Therefore, when the second bonding metal member 152a is heated and melted, it is made easy to come into contact with the bonding part metal film 131 on the Si substrate 110 to be the counterpart side, facilitating it to wet spread, thereby facilitating sealing of the gap 171.

Figure 47B:
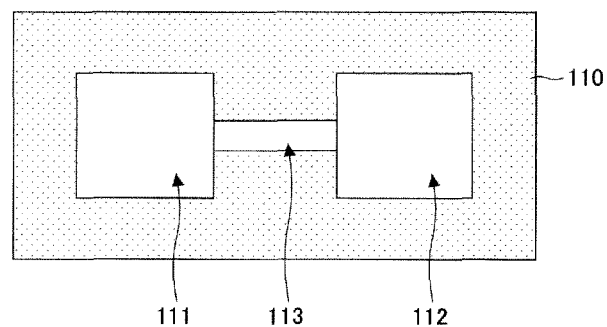
Figure 47C:
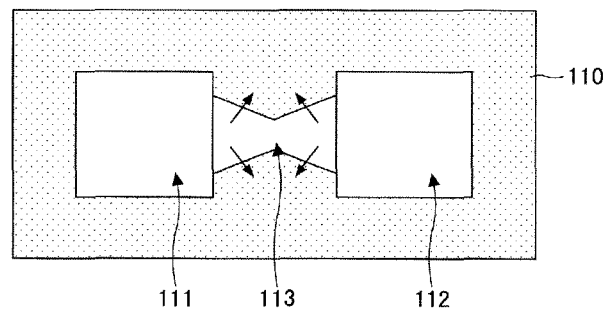

Moreover, in the present embodiment, there is no need to form the groove and it suffices to form only an opening of the Si substrate, making it possible to fabricate stably and accurately even with wet etching. For example, as illustrated in FIG. 47B, a case is considered of simultaneously forming the first opening 111, and the second opening 112, and the groove 113 by wet etching. In this case, an etching time for forming the first opening 111 and the second opening 112 is long, so that, as illustrated in FIG. 47B, etching by the groove 113 proceeds, making it difficult to accurately form the groove 113. Therefore, it is necessary to separately form the groove 113 after forming the first opening 111 and the second opening 112. However, according to the present embodiment, it suffices to form the second opening 112 and the first opening 111 being square by wet etching, making it possible to accurately fabricate even with etching over a long time.

Figure 48A:
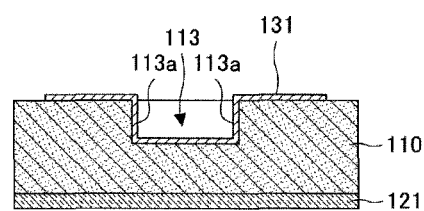
FIGS. 48A and 48B are second parts of the diagram for explaining the alkali metal cell fabricating method according to the fifth embodiment.
Figure 48B:
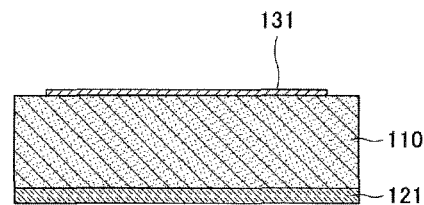

Moreover, according to the present embodiment, a step such as forming the groove 113 does not exist, facilitating a step of forming the bonding part metal film 131 to the Si substrate 110. In other words, when there is the groove 113 as illustrated in FIG. 48A, it is necessary to accurately form the bonding part metal film 131 even on the side face 113a of the groove 113. However, as illustrated in FIG. 48B according to the present embodiment, the bonding part metal film 131 is formed on a flat Si substrate 110, making it possible to perform fabrication easier relative to the first embodiment.

Other features in the above embodiment are the same as those in the first embodiment.

Sixth Embodiment

Next, a sixth embodiment is described. According to an alkali metal cell fabricating method in the present embodiment, two or more cells can be fabricated simultaneously for one raw material chamber.

Figure 49:
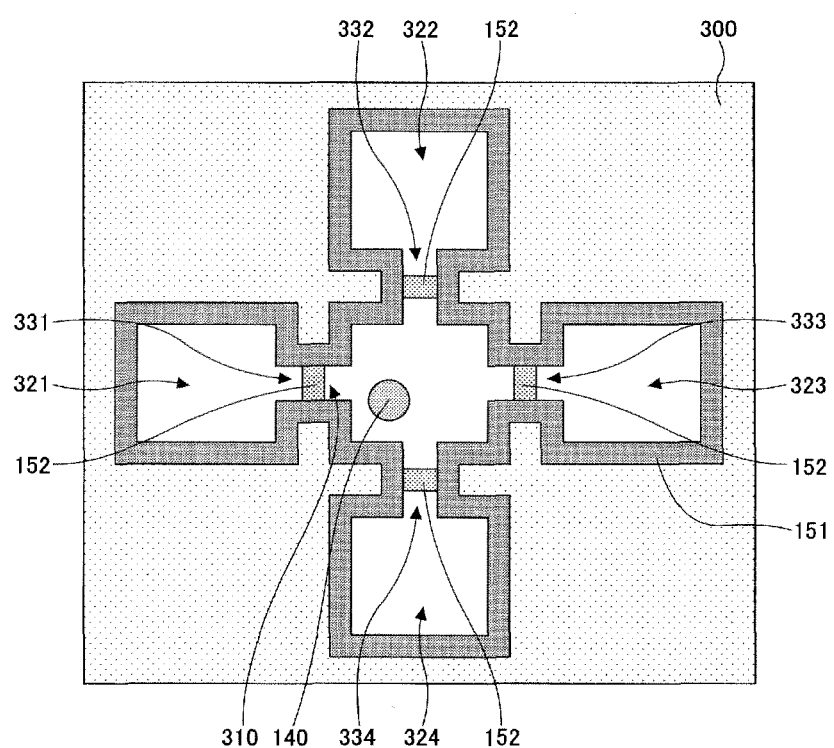
FIG. 49 is a first part of the diagram for explaining the alkali metal cell fabricating method according to a sixth embodiment.

More specifically, as illustrated in FIG. 49, in an Si substrate 300 is formed with an opening 310 to be a raw material chamber penetrating the Si substrate 300 and openings 321, 322, 323, and 324 to be cells. Moreover, there are provided a groove 331 between the opening 310 and the opening 321; a groove 332 between the opening 310 and the opening 322; a groove 333 between the opening 310 and the opening 323; and a groove 334 between the opening 310 and the opening 324. The respective openings are spatially connected by these grooves.

To the other face of the Si substrate 300 is bonded a first glass substrate (not shown). Moreover, a second glass substrate (not shown) is bonded to one face of the Si substrate 300 surrounding the opening 310 and the openings 321, 322, 323, and 324 by the first bonding metal layer 151 formed by application by the first bonding metal member.

Furthermore, the respective grooves 331, 332, 333, and 334 of the Si substrate 300 are blocked by the second bonding metal layer 152. More specifically, a second bonding metal member is provided in the grooves 331, 332, 333, and 334 of the Si substrate 300, causing an alkali metal such as Cs, etc., from the compound 140 containing an alkali metal to be formed. Thereafter, the second bonding metal member is heated to at least 280° C. to melt the second bonding metal member, after which it is cooled to form a second bonding metal layer 152, making it possible to block the respective grooves.

Thereafter, a surrounding of an area in which the openings 321, 322, 323, and 324 are formed is cut by dicing, etc., making it possible to fabricate an alkali metal cell according to the present embodiment. In a case illustrated in FIG. 49, for example, this makes it possible to simultaneously fabricate four alkali metal cells against the opening 310 to be one raw material chamber by the openings 321, 322, 323, and 324. Thus, the alkali metal cell may be fabricated at low cost. The opening 310 according to the present embodiment corresponds to the first opening 111 in the first embodiment, while the openings 321, 322, 323, and 324 correspond to the second opening 112 in the first embodiment. Moreover, the grooves 331, 332, 333, and 334 correspond to the groove 113 in the first embodiment.

Figure 50:
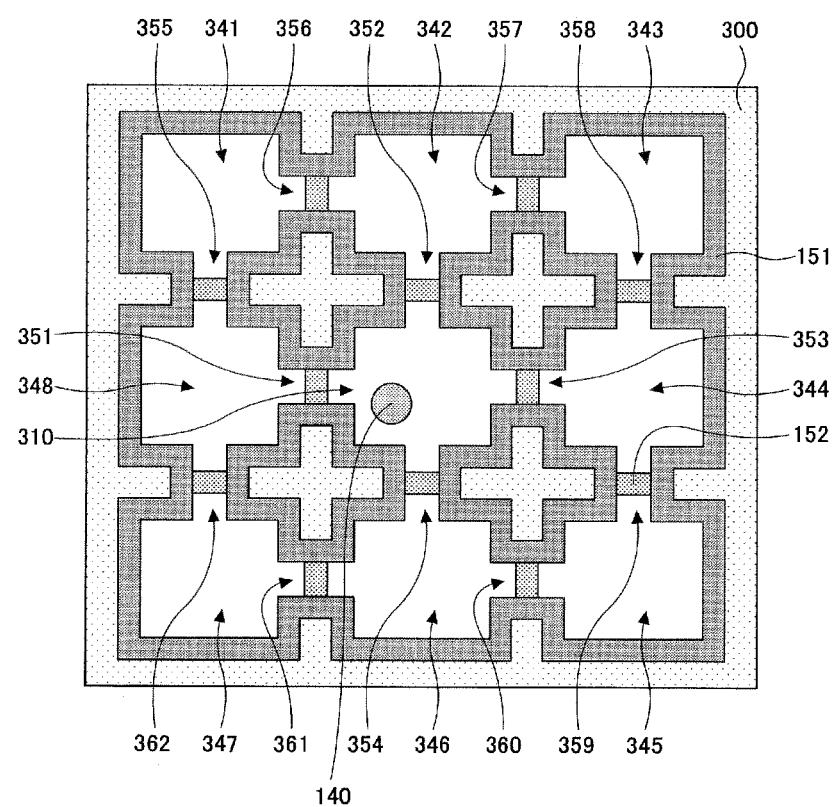
FIG. 50 is a second part of the diagram for explaining the alkali metal cell fabricating method according to the sixth embodiment.

Furthermore, as shown in FIG. 50, in the present embodiment, one opening 310 to be a raw material chamber and eight openings 341, 342, 343, 344, 345, 346, 347, and 348 to be cells may be formed. Grooves 351, 352, 353, 354, 355, 356, 357, 358, 359, 360, 361, and 362 are provided between neighboring openings 310, 341, 342, 343, 344, 345, 346, 347, and 348. The respective openings are spatially connected by these grooves. More specifically, there are provided the groove 351 between the opening 310 and the opening 348; the groove 352 between the opening 310 and the opening 342; the groove 353 between the opening 310 and the opening 344; and the groove 354 between the opening 310 and the opening 346. Moreover, there are provided the groove 355 between the opening 348 and the opening 341; the groove 356 between the opening 341 and the opening 342; the groove 357 between the opening 342 and the opening 343; and the groove 358 between the opening 343 and the opening 344. Furthermore, there are provided the groove 359 between the opening 344 and the opening 345; the groove 360 between the opening 345 and the opening 346; the groove 361 between the opening 346 and the opening 347; and the groove 362 between the opening 347 and the opening 348.

To the other face of the Si substrate 300 is bonded a first glass substrate (not shown) by anodic bonding. Moreover, a second glass substrate (not shown) is bonded to one face of the Si substrate 300 surrounding the opening 310 and the openings 341, 342, 343, 344, 345, 346, 347, and 348 by the first bonding metal layer 151. This first bonding metal layer 151 is formed by application by the first bonding metal member.

Moreover, the grooves 351, 352, 353, 354, 355, 356, 357, 358, 359, 360, 361, and 362 of the Si substrate 300 are blocked by the second bonding metal layer 152. More specifically, the second bonding metal member is provided in the grooves 351, 352, 353, 354, 355, 356, 357, 358, 359, 360, 361, and 362 of the Si substrate 300, causing an alkali metal such as Cs, etc., to be produced from the compound 140 containing an alkali metal. Thereafter, the second bonding metal member is heated to at least 280° C. to melt the second bonding metal member, after which it is cooled to form the second bonding metal layer 152, making it possible to block the respective grooves.

Thereafter, a surrounding of an area in which the openings 341, 342, 343, 344, 345, 346, 347, and 348 are formed is cut by dicing, etc., making it possible to fabricate an alkali metal cell according to the present embodiment. In a case illustrated in FIG. 50, for example, this makes it possible to simultaneously fabricate eight alkali metal cells against the opening 310 to be one raw material chamber by the openings 341, 342, 343, 344, 345, 346, 347, and 346. Thus, the alkali metal cell may be fabricated at low cost.

Other features in the above embodiment are the same as those in the first embodiment. Moreover, the present embodiment is applicable to the second to fifth embodiments.

Seventh Embodiment

Figure 51:
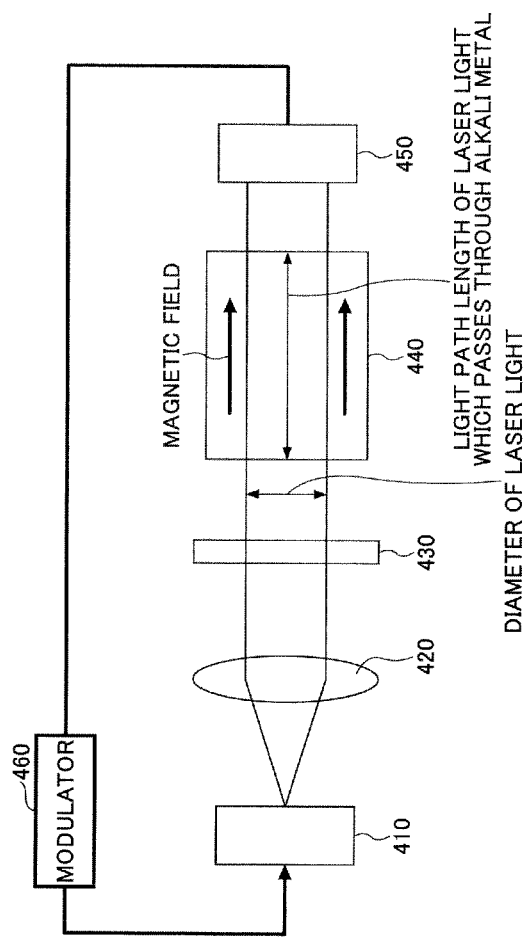
FIG. 51 is a diagram for explaining the atomic oscillator according to a seventh embodiment.

Next, a seventh embodiment is described. The present embodiment is an atomic oscillator using an alkali metal cell according to the first to the sixth embodiments. Based on FIG. 51, an atomic oscillator according to the present embodiment is described. The atomic oscillator according to the present embodiment, which is a CPT-type small atomic oscillator, includes a light source 410; a collimating lens 420, a λ/4 plate 430, an alkali metal cell 440; an optical detector 450; and a modulator 460. This atomic oscillator causes two lights of different frequencies out of lights including sidebands emitted from the light source 410 to be incident on the alkali metal cell 440 to thereby control the oscillating frequency due to a light absorbing characteristic due to quantum interference effect by two types of resonant lights.

For the light source 410, a surface emitting laser device is used. The alkali metal cell 440 has sealed therein a Cs (Cesium) atom gas as an alkali metal and uses the D1 line transition. For the photo detector 450, a photo diode is used.

In the atomic oscillator according to the present embodiment, a light emitted from the light source 410 is irradiated onto the alkali metal cell 440 in which is sealed the Cesium atom gas, exciting electrons in the Cesium atoms. A light which passes through the alkali metal cell 440 is detected in the photo detector 450, and a signal detected in the photo detector 450 is fed back to the modulator 460, which modulates a surface emitting laser device in the light source 410 by the modulator 460.

Figure 52:
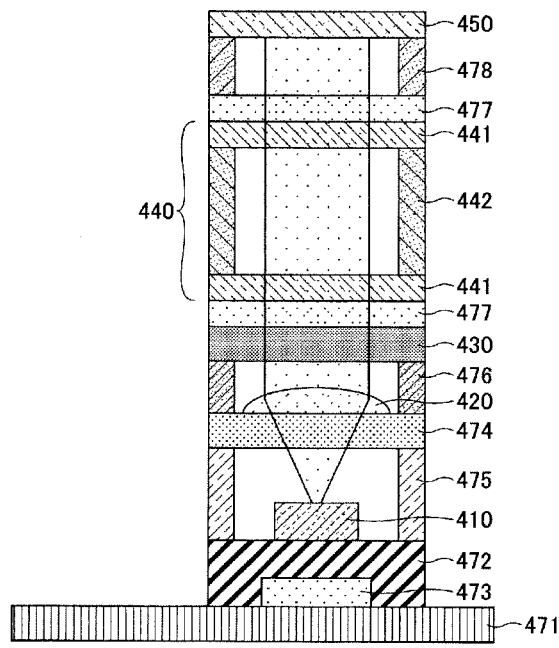
FIG. 52 is a structural diagram of the atomic oscillator according to the seventh embodiment.

Based on FIG. 52, an atomic oscillator according to the present embodiment is described. The atomic oscillator according to the present embodiment is formed in longitudinal direction on a circuit substrate 471. An alumina substrate 472 is provided on the circuit substrate 471, while a surface emitting laser device to be the light source 410 is provided on the alumina substrate 472. In the alumina substrate 472, a heater 473 for surface emitting laser is provided for controlling temperature, etc., of the light source 410. Above the light source 410, a ND (neutral density) filter 474 is provided. The ND filter 474 is provided at a predetermined position by a heat-insulating spacer 475 formed by glass, etc. The collimating lens 420 is provided over the ND filter 474 and the λ/4 plate 430 is provided above the collimating lens. The λ/4 plate 430 is provided at a predetermined position by spacers 476 formed by silicon, etc. The alkali metal cell 440 is provided above the λ/4 plate 430. The alkali metal cell 440 includes two glass substrates 441. With the two glass substrates 441 opposing each other, edge portions thereof are connected by a silicon substrate 442. An alkali metal is sealed in a portion surrounded by the glass substrate 441 and the silicon substrate 442. In the alkali metal cell 440, a face through which a laser light passes is formed by the glass substrate 441. On each side of the alkali metal cell 440 is provided a heater 477 for a cell, making it possible to set the alkali metal cell 440 to a predetermined temperature. Above the alkali metal cell 440 is provided a photo detector 450, which is provided at a predetermined position by spacers 478 made of silicon.

Figure 53:
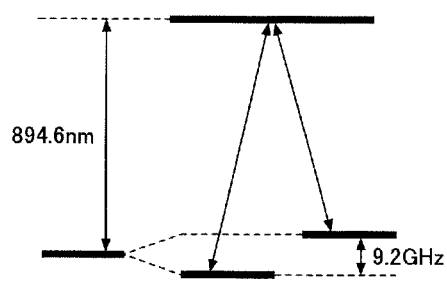
FIG. 53 is a diagram for explaining an atomic energy level for explaining a CPT method.
Figure 54:
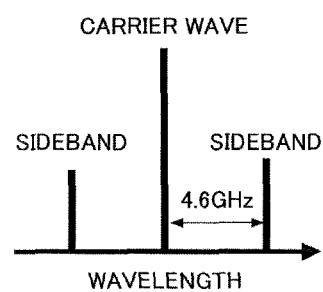
FIG. 54 is a diagram for explaining an output wavelength at a time of modulating a surface emitting laser.
Figure 55:
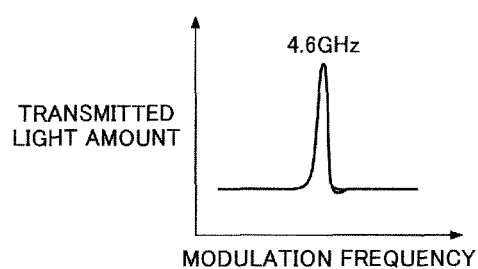
FIG. 55 is a diagram of correlation between a modulation frequency and a transmitted light amount.

Next, FIG. 53 illustrates an atomic energy level related to CPT. A use is made of a reduced light absorbance when electrons are simultaneously excited from two base levels to an excited level. A surface emitting laser uses a device with a carrier wavelength close to 894.6 nm. The carrier wavelength may be tuned by changing an output or a temperature of the surface emitting laser. As illustrated in FIG. 54, applying modulation causes a sideband to be produced on both sides of the carrier wave. Modulation is applied at 4.6 GHz such that a frequency difference thereof corresponds to 9.2 GHz, which is an intrinsic vibration frequency of a Cs atom. As shown in FIG. 55, a laser light passing through a Cs gas excited becomes maximum when a sideband frequency difference corresponds to an intrinsic frequency difference of the Cs atom. Thus, a modulation frequency of a surface emitting laser device in the light source 410 is adjusted by feeding back an output of the photo detector 450 in the modulator 460 such that it maintains a maximum value. As the intrinsic frequency of the atom is quite stable, the modulation frequency will have a stable value, which is taken out as an output. For a wavelength of 894.6 nm, a wavelength in a range of ±1 nm is needed.

In the atomic oscillator according to the present embodiment, any of alkali metal cells in the first to the sixth embodiments are used in the alkali metal cell 440. Moreover, in the alkali metal cell 440 of the atomic oscillator in the present embodiment, the silicon substrate 442 corresponds to the Si substrate 110 in the first embodiment, etc. Moreover, the glass substrate 441 corresponds to the first glass substrate 121 and the second glass substrate 122 in the first embodiment, etc.

Moreover, while Cs is used as the alkali metal and a surface emitting laser with a wavelength of 894.6 nm is used to utilize a transition of a D1 line thereof in the present embodiment, 852.3 nm may be used for using a D2 line of Cs. Furthermore, Rb (Rubidium) may be used as the alkali metal. A wavelength of 795.0 nm may be used to utilize the D1 line, while a wavelength of 780.2 nm may be used to utilize the D2 line. Moreover, modulation frequencies for using Rb are 3.4 GHz for $^{87}$Rb; and 1.5 GHz for $^{85}$Rb. For these wavelengths, a wavelength in a range of ±1 nm is needed.

Eighth Embodiment

The features in FIGS. 2A to 7B, 14A, and 14B, and 16 in the first embodiment are the same according to an eighth embodiment, so that repeated explanations are omitted.

Below, an alkali metal cell and an alkali metal cell fabricating method according to the eighth embodiment are described based on FIGS. 56A to 62.

Figure 56A:
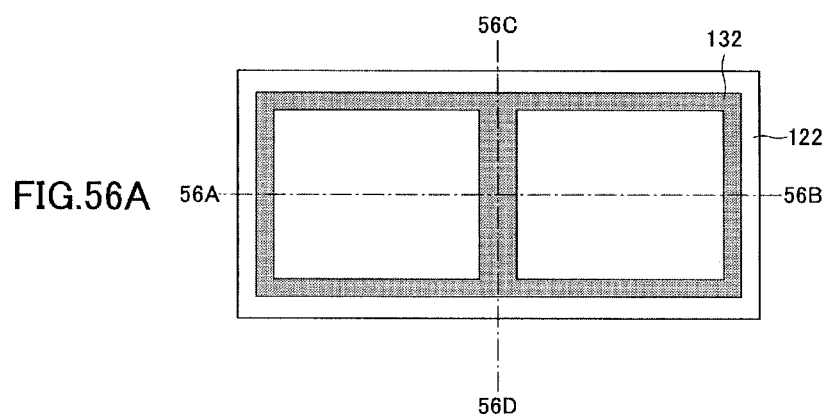
FIGS. 56A to 56C are first parts of the process chart of the alkali metal cell fabricating method according to an eighth embodiment.
Figure 56B:
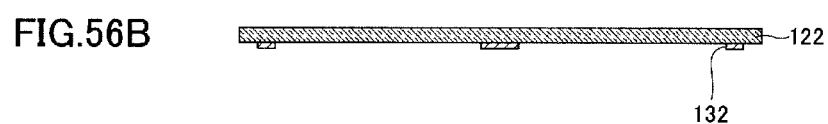
Figure 56C:
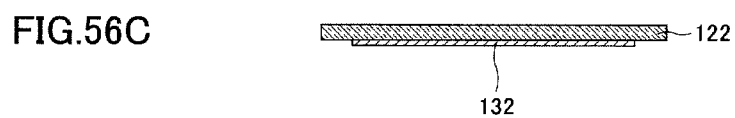

As illustrated in FIGS. 56A to 56C, a second glass substrate 122 which is a second transparent substrate is prepared and a bonding part metal film 132 is formed on one face of the second glass substrate 122. More specifically, a photo resist is coated onto the one face of the second glass and exposed and developed by an aligner, so that a resist pattern (not shown) is formed which has an opening in an area in which the bonding part metal film 132 is formed. Thereafter, a metal laminated film containing Au: 700 nm/Cr: 10 nm is formed by sputtering, vacuum deposition, etc., on a face on which the resist pattern is formed. Thereafter, by soaking into an organic solvent, etc., the metal laminated film formed on the resist pattern is removed by a lift-off with the resist pattern, so that the bonding part metal film 132 is formed by the metal laminated film remaining on the one face of the second glass substrate 122. The bonding part metal film 132 formed in this way is formed at such a position as to correspond to the bonding part metal film 131 formed on one face of the Si substrate 110. FIG. 56A is a top face view in this process; FIG. 56B is a sectional view cut in a dot-dash line 56A-56B in FIG. 56A; and FIG. 56C is a sectional view cut in a dot-dash line 56C-56D in FIG. 56A.

Figure 57A:
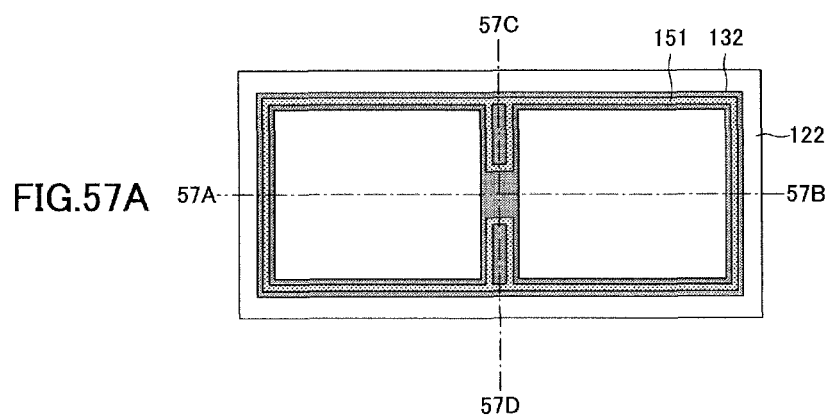
FIGS. 57A to 57C are second parts of the process chart of the alkali metal cell fabricating method according to the eighth embodiment.
Figure 57B:
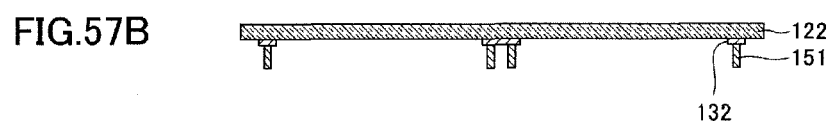
Figure 57C:
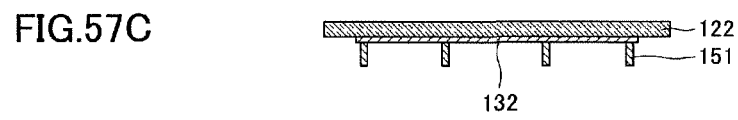

Next, as shown in FIGS. 57A to 57C, a first bonding metal member 151 which is formed by a first bonding metal is formed on the bonding part metal film 132 of the second glass substrate 122. In the present embodiment, the first bonding metal layer 151 is formed by an AuSn alloy with a weight ratio of Au:Sn=10:90 with a melting temperature of 217° C.

More specifically, a photo resist is coated onto the one face of the second glass substrate 122 on which the bonding part metal film 132 is formed and exposed and developed by the aligner, so that a resist pattern (not shown) is formed which has an opening in an area in which the first bonding part metal layer 151 is formed. Thereafter, a metal film made of AuSn (with a weight ratio of Au:Sn=10:90) is formed by vacuum deposition or sputtering, after which it is soaked in an organic solvent, etc., to thereby remove, by a lift off with the resist pattern, the metal film formed on the resist pattern. In this way, the first bonding metal layer 151 is formed over the bonding part metal film 132 in one face of the second glass substrate 122. The first bonding metal layer 151 formed in this way has a width of approximately 20 μm and a thickness of approximately 20 μm. FIG. 57A is a top face view in this process. FIG. 57B is a sectional view cut in a dot-dash line 57A-57B in FIG. 57A. FIG. 57C is a sectional view cut in a dot-dash line 57C-57D in FIG. 57A.

Figure 58A:
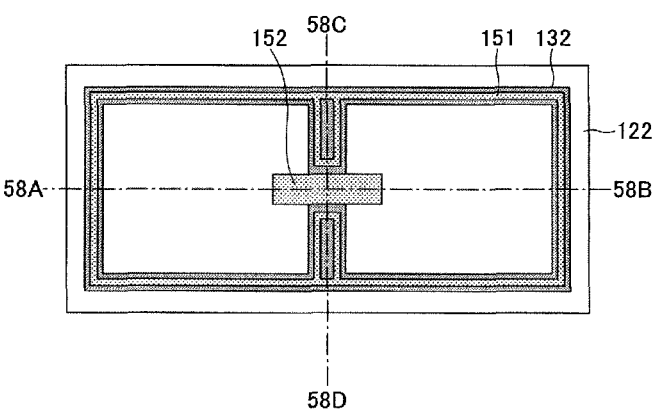
FIGS. 58A to 58C are third parts of the process chart of the alkali metal cell fabricating method according to the eighth embodiment.
Figure 58B:
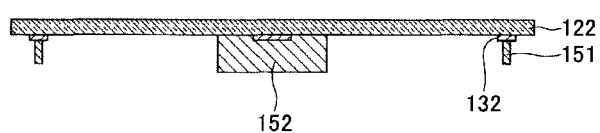
Figure 58C:
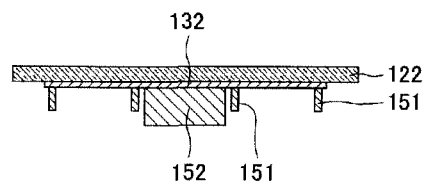

Next, as shown in FIGS. 58A to 58C, a second bonding metal layer 152 which is formed by a second bonding metal is formed in a portion corresponding to the groove 113 in the Si substrate 110 in the second glass substrate 122. In the present embodiment, the second bonding metal layer 152 is formed by an AuSn alloy with a weight ratio of Au:Sn=80:20 with a melting temperature of approximately 280° C.

More specifically, a photo resist is coated onto the one face of the second glass substrate 122 on which the bonding part metal film 132 is formed and exposed and developed by the aligner, so that a resist pattern (not shown) is formed which has an opening in an area in which the second bonding part metal layer 152 is formed. Thereafter, a metal film made of AuSn (with a weight ratio of Au:Sn=80:20) is formed by vacuum deposition or sputtering, after which it is soaked in an organic solvent, etc., to thereby remove, by a lift off with the resist pattern, the metal film formed on the resist pattern. In this way, the second bonding metal layer 152 is formed in a portion corresponding to the groove 113 of the Si substrate 110. The second bonding metal layer 152 formed in this way has a width of approximately 20 μm and a thickness of approximately 20 μm. FIG. 58A is a top face view in this process. FIG. 58B is a sectional view cut in a dot-dash line 58A-58B in FIG. 58A. FIG. 58C is a sectional view cut in a dot-dash line 58C-58D in FIG. 58A.

Figure 59A:
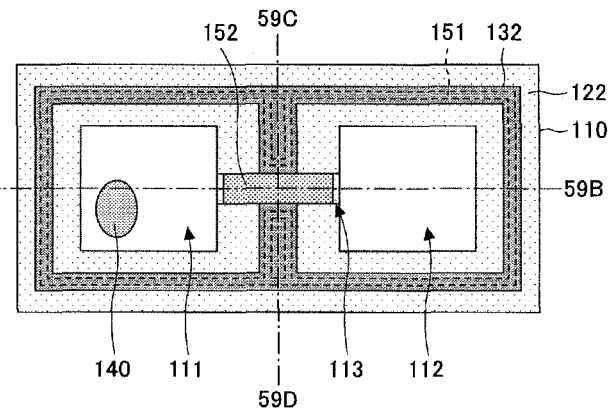
FIGS. 59A to 59C are fourth parts of the process chart of the alkali metal cell fabricating method according to the eighth embodiment.
Figure 59B:
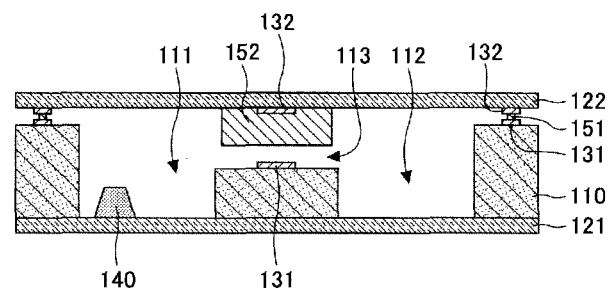
Figure 59C:
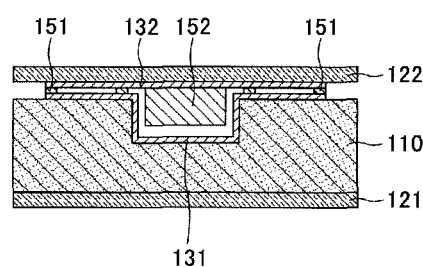

Next, as shown in FIGS. 59A to 59C, the one face of the Si substrate 110 and the one face of the second glass substrate 122 are bonded by the first bonding metal layer 151. FIG. 59A is a top face view in this process. FIG. 59B is a sectional view cut in a dot-dash line 59A-59B in FIG. 59A. FIG. 59C is a sectional view cut in a dot-dash line 59C-59D in FIG. 59A.

More specifically, in a vacuum chamber into which nitrogen gas to be a buffer gas is introduced to produce the nitrogen atmosphere, the bonding part metal film 131 which is formed on one face of the Si substrate 110 is made to be in contact with the second bonding metal film 152 which is formed on one face of the second glass substrate 122. Thereafter, pressurizing is conducted for 30 minutes at a temperature of at least 217° C., or 230° C., for example. In this way, the one face of the Si substrate 110 and the one face of the second glass substrate 122 are bonded by the first bonding metal layer 151. In this way, the one face side of the first opening 111 and the second opening 112 in the Si substrate 110 has the second glass substrate 122 bonded by the first bonding metal layer 151 and is blocked by the second glass substrate 122. In this way, an enclosed space including the first opening 111, the second opening 112, and the groove 113 is formed.

In such a bonding using AuSn (with the weight ratio of Au:Sn=10:90), gas such as oxygen, etc., is not produced at the time of bonding, so that impurities such as oxygen, etc., do not enter the first opening 111 in which the compound 140 containing the alkali metal is placed.

At the bonding temperature (approximately 230° C.) in the first bonding metal layer 151, the melting temperature of the second bonding metal forming the second bonding metal layer 152 is 280° C., so that the second bonding metal layer 152 does not melt. Thus, while the second bonding metal layer 152 is formed in the second glass substrate 122, a space with the first opening 111 and a space with the second opening 112 are kept spatially connected via the groove 113.

Figure 60A:
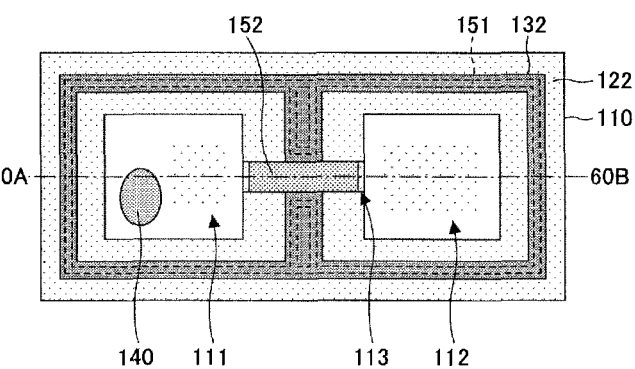
FIGS. 60A and 60B are fifth parts of the process chart of the alkali metal cell fabricating method according to the eighth embodiment.
Figure 60B:
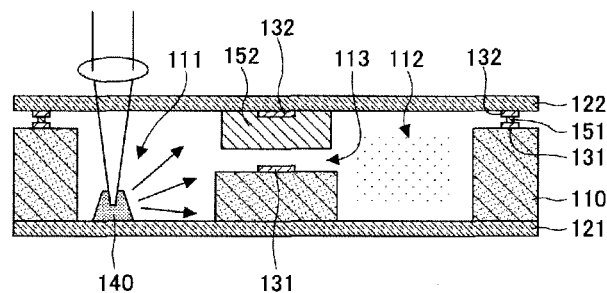

Next, as illustrated in FIGS. 60A and 60B, an alkali metal gas is produced by the compound 140 containing an alkali metal that is provided in the first opening 111. FIG. 60A is a top face view in this process, while FIG. 60B is a sectional view cut in a dot-dash line 60A-60B in FIG. 60A.

More specifically, when using a Cs dispenser, which is stable in the atmosphere as the compound 140 containing the alkali metal, a laser light is irradiated onto the Cs dispenser which is provided in the first opening 111 to heat, causing Cs gas (an alkali metal gas) to be produced. Heating is conducted by collecting irradiated laser light onto the compound 140 containing the alkali metal, so that the second bonding metal with the melting temperature of 280° C. does not melt. The melting point of Cs contained in the compound 140 containing the alkali metal is approximately 28° C. The compound 140 containing the alkali metal is irradiated by the laser light and heated to at least the melting temperature, causing Cs to be liquid and gas. Cs, which became gas, etc., passes through the groove 113 and enters the second opening 112. In addition to the above-described method of producing the alkali metal by irradiating the laser light onto the compound 140 containing the alkali metal, the alkali metal may be produced by heating the compound 110 containing the alkali metal or irradiating an ultraviolet light (UV light).

Next, as illustrated in FIGS. 61A to 61C, a second bonding metal layer 152 which is provided in the second glass substrate 112 is heated to 280° C. or above, melted, and then cooled to block the groove 113 by the second bonding metal layer 152. In this way, a gap between the space in the first opening 111 and the space in the second opening 112 is blocked, so that they are spatially separated. An AuSn alloy (with a weight ratio of Au:Sn=80:20), which is a second bonding metal forming the second bonding metal layer 152, is a type of brazing material with superior wettability. Therefore, when the AuSn alloy (with the weight ratio of Au:Sn=80:20), which is the second bonding metal, is heated to turn to liquid, it becomes easy to wet spread to the bonding part metal films 131 and 132 which are formed by a metal material. Thus, cooling after heating the second bonding metal layer 152 to 280° C. or above may cause the groove 113 to be easily blocked. Then, in order to prevent the first bonding metal layer 151 from melting, it is preferable to heat by a method of allowing a portion in which the second bonding metal layer 152 is formed to be irradiated with a laser light or allowing only the portion to be partially heated. FIG. 61A is a top face view in this process. FIG. 61B is a sectional view cut in a dot-dash line 61A-61B in FIG. 61A. FIG. 61C is a sectional view cut in a dot-dash line 61C-61D in FIG. 61A.

Figure 62:
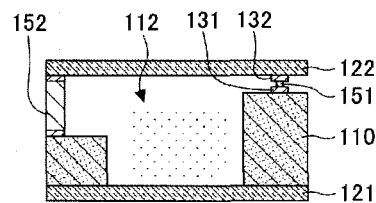
FIG. 62 is a structural diagram of the alkali metal cell according to the eighth embodiment.

FIG. 62 illustrates an alkali metal cell according to the present embodiment. The alkali metal cell according to the present embodiment has the inside of the cell being formed by the second opening 112, while the first glass substrate 121 is bonded to the other face of the Si substrate 110 by anodic bonding. Moreover, to the one face of the Si substrate 110 are bonded the second bonding metal layer 152 formed by the second bonding metal and the first bonding metal layer 151 in which the second glass substrate 122 is formed by the first bonding metal. Here, the melting temperature of the first bonding metal forming the first bonding metal layer 151 is 217° C., while the melting temperature of the second bonding metal forming the second bonding metal layer 152 is 280° C. Thus, the bonding temperature of the second bonding metal forming the second bonding metal layer 152 is higher than the bonding temperature of the first bonding metal forming the first bonding metal layer 151.

For the first bonding metal, AuSn (with the weight ratio of Au:Sn=10:90), AuSn (with the weight ratio of Au:Sn=80:20), etc., may be used. Moreover, for the second bonding metal, AuSn (with the weight ratio of Au:Sn=80:20), AuGe (with the weight ratio of Au:Ge=87.5:12.5), AuSi (with the weight ratio of Au:Si=96.8:3.2), etc., may be used. The melting temperature of AuGe (with the weight ratio of Au:Ge=87.5:12.5) is 361° C., while the melting temperature of AuSi (with the weight ratio of Au:Si=96.8:3.2) is 363° C. According to the present embodiment, it suffices that a combination of materials is such that the bonding temperature of the second bonding metal forming the second bonding metal layer 152 is higher than the bonding temperature of the first bonding metal forming the first bonding metal layer 151.

For example, when AuSn (with the weight ratio of Au:Sn=10:90) is used for the first bonding metal, AuSn (with the weight ratio of Au:Sn=80:20), AuGe (with the weight ratio of Au:Ge=87.5:12.5), AuSi (with the weight ratio of Au:Si=96.8:3.2), etc., may be used. Moreover, when AuSn (with the weight ratio of Au:Sn=80:20) is used for the first bonding metal, AuGe (with the weight ratio of Au:Ge=87.5:12.5), AuSi (with the weight ratio of Au:Si=96.8:3.2), etc., may be used. Furthermore, when AuSn is used for both the first bonding metal and the second bonding metal, AuSn (with the weight ratio of Au:Sn=10:90) is used for the first bonding metal and AuSn (with the weight ratio of Au:Sn=80:20) is used for the second bonding metal. In this case, the first bonding metal contains more Sn than the second bonding metal.

Furthermore, as described above, when the compound 140 containing the alkali metal cell is sealed in the cell inner part formed by the first opening 111, it is preferable to seal with a buffer gas such as nitrogen, etc., rather than within a vacuum. Colliding of an alkali metal atom in the cell inner part to a cell wall causes an internal state of the alkali metal atom to change, causing frequency stability to decrease when used in the atomic oscillator. Thus, sealing the buffer gas such as nitrogen, etc., in the cell inner part makes it possible to decrease the probability of collision of the alkali metal atoms with the wall of the cell inner part and to suppress a decrease in the frequency stability. As the buffer gas, an inert gas is preferable, including nitrogen, neon, argon, a mixed gas of neon and argon, etc.

Moreover, in the alkali metal cell fabricating method according to the present embodiment, a resist pattern 162 having an opening 162a shown in FIG. 16 may be used instead of the resist pattern 161 having the opening 161a that is shown in FIGS. 5A and 5B. Such a resist pattern 162 may be formed by using a dry film resist. More specifically, the dry film resist is pasted to one face of the Si substrate 110 and is exposed and developed by the aligner, making it possible to form the resist pattern 162 having the opening 162a in an area in which the bonding part metal film 131 is formed. As for a subsequent process, a metal laminated film containing Au: 700 nm/Cr: 10 nm is formed by sputtering, vacuum deposition, etc., on a face on which the resist pattern 162 is formed as shown in FIGS. 6A to 6C. Thereafter, by soaking into an organic solvent, etc., the metal laminated film formed on the resist pattern 162 is removed by a lift-off with the resist pattern 162, so that the bonding part metal film 131 is formed by a remaining metal laminated film.

Moreover, the first bonding metal layer 151 may be formed on one face of the Si substrate 110, or may be formed on one face of the second glass substrate 122 as described above. Moreover, the second bonding metal layer 152 may be formed in the groove 113 of the Si substrate 110, or, as described above, may be formed in a portion corresponding to the groove 113 in one face of the second glass substrate 122.

Ninth Embodiment

The features in FIGS. 21A to 21C, 22, and 23 in the second embodiment are the same according to an ninth embodiment, so that repeated explanations are omitted.

Below, an alkali metal cell and an alkali metal cell fabricating method according to the ninth embodiment are described based on FIGS. 63A to 66B.

Next, the ninth embodiment is described. In the alkali metal cell and the alkali metal cell fabricating method according to the present embodiment, the second bonding metal layer 152 is provided at two locations in a portion corresponding to the groove 113 of the Si substrate 110, taking into account a case of cutting by dicing.

Figure 63A:
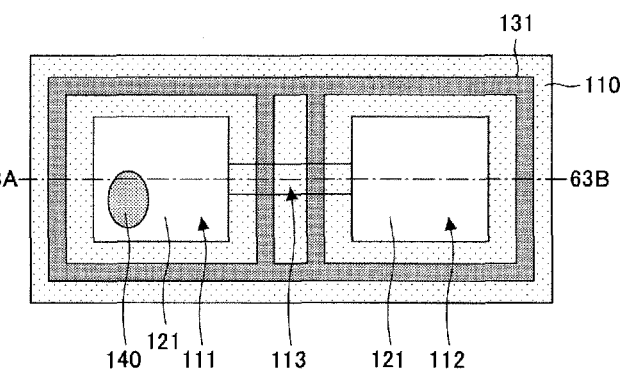
FIGS. 63A and 63B are first parts of the process chart of the alkali metal cell fabricating method according to a ninth embodiment.
Figure 63B:
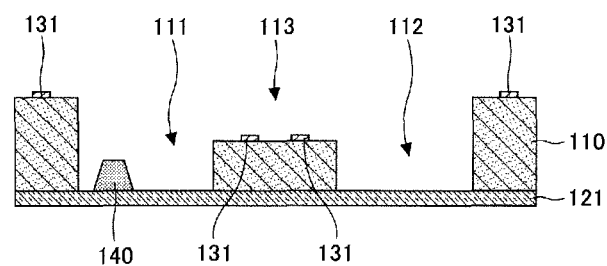

First, as illustrated in FIGS. 63A and 63B, the other face of the Si substrate 110 that has the first glass substrate 121 bonded thereto is fabricated. Two bonding part metal films 131 are formed on one face of the Si substrate 110 in between the first opening 111 and the second opening 112. Moreover, the compound 140 containing the alkali metal is provided in the first opening 111. This process corresponds to the process illustrated in FIGS. 7A and 7B in the method of fabricating the alkali metal cell according to the first and eighth embodiments and may be formed by the method of fabricating similar to the first and eighth embodiments. FIG. 63A is a top face view in this process, while FIG. 63B is a sectional view cut in a dot-dash line 63A-63B in FIG. 63A.

Figure 64A:
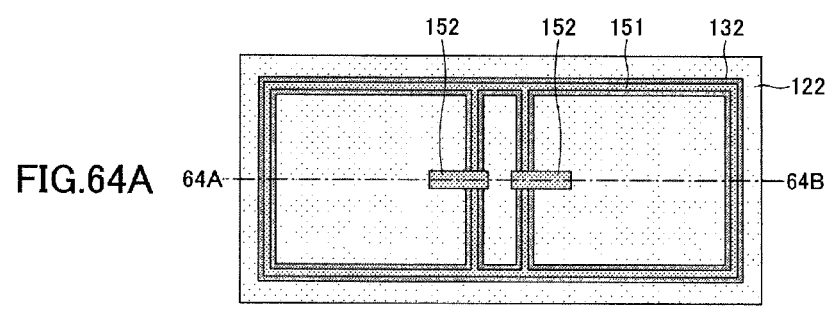
FIGS. 64A and 64B are second parts of the process chart of the alkali metal cell fabricating method according to the ninth embodiment.
Figure 64B:
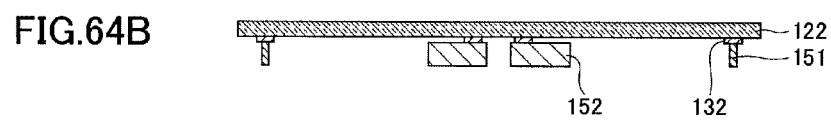

Next, as illustrated in FIGS. 64A and 64B, the bonding part metal film 132 is formed on one face of the second glass substrate 122, and the first bonding metal layer 151 is formed on the bonding part metal film 132. In correspondence with the bonding part metal film 131 formed in the Si substrate 110 shown in FIGS. 63A and 63B, the bonding part metal film 132 and the first bonding metal layer 151 are formed between the first opening 111 and the second opening 112. This process corresponds to the process illustrated in FIGS. 58A to 58C in the method of fabricating the alkali metal cell according to the eighth embodiment and may be formed by a fabricating method similar to the eighth embodiment. FIG. 64A is a top face view in this process, while FIG. 64B is a sectional view cut in a dot-dash line 64A-64B in FIG. 64A.

Next, as shown in FIGS. 65A and 65B, the one face of the Si substrate 110 and the one face of the second glass substrate 122 are bonded by the first bonding metal layer 151. This process corresponds to the process illustrated in FIGS. 59A to 59C in the alkali metal cell fabricating method according to the eighth embodiment and may be formed by a fabricating method similar to the eighth embodiment. FIG. 65A is a top face view in this process, while FIG. 65B is a sectional view cut in a dot-dash line 65A-65B in FIG. 65A.

Figure 66A:
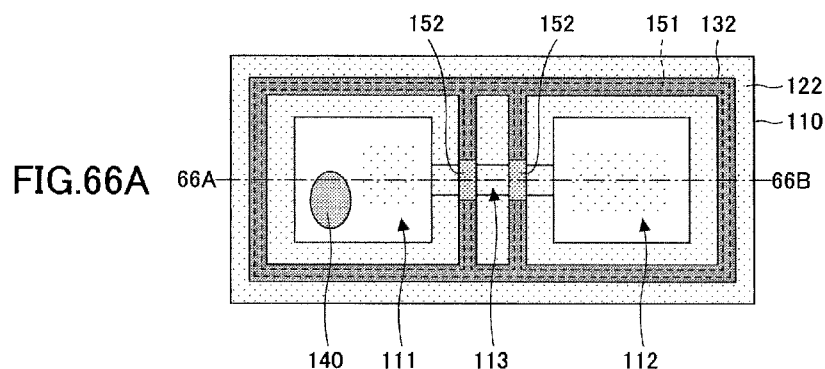
FIGS. 66A and 66B are fourth parts of the diagram for explaining the alkali metal cell fabricating method according to the ninth embodiment.
Figure 66B:
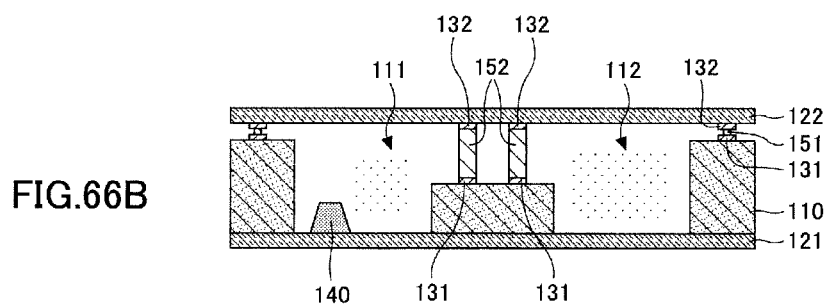

Next, as illustrated in FIGS. 66A and 66B, an alkali metal gas, etc., is produced by the compound 140 containing the alkali metal, after which the groove 113 is blocked by the second bonding metal layer 152 formed in the second glass substrate 122. More specifically, the second bonding metal layer 152 which is formed in the second glass substrate 122 is heated to 280° C. or above, melted, and then cooled to block the groove 113 by the second bonding metal layer 152. In this way, a gap between the space in the first opening 111 and the space in the second opening 112 is blocked, so that they are spatially separated. Here in the groove 113 between the first opening 111 and the second opening 112, blocking occurs by second bonding metal layers 152 formed in two locations. This process corresponds to the process illustrated in FIGS. 61A to 61C in the alkali metal cell fabricating method according to the eighth embodiment and may be formed by a fabricating method similar to the eighth embodiment. FIG. 66A is a top face view in this process, while FIG. 66B is a sectional view cut in a dot-dash line 66A-66B in FIG. 66A.

Other features in the above embodiment are the same as those in the eighth embodiment.

Tenth Embodiment

Next, a tenth embodiment is described. According to an alkali metal cell fabricating method in the present embodiment, two or more cells can be fabricated simultaneously for one raw material chamber.

Figure 67:
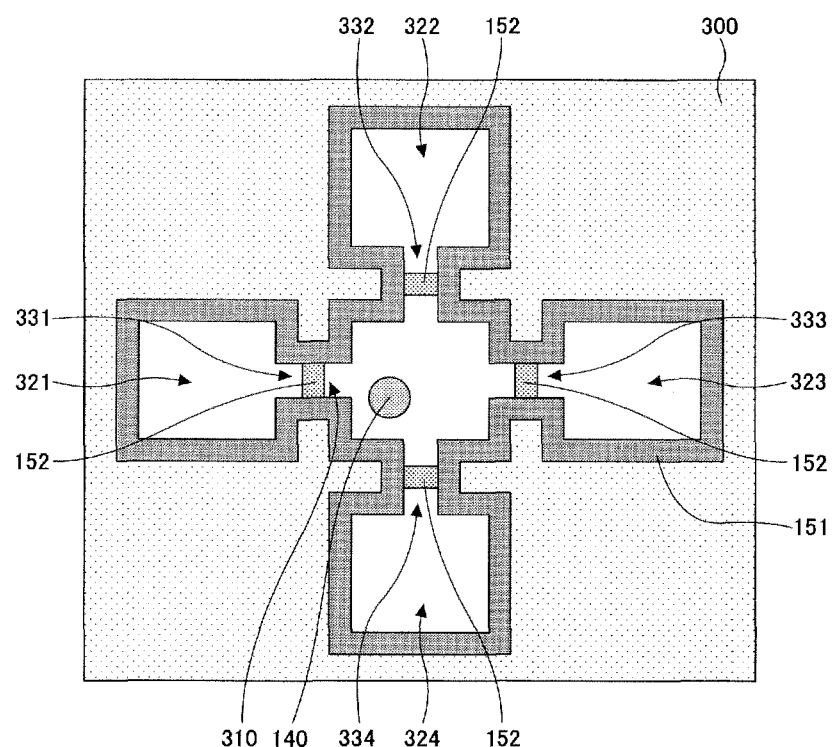
FIG. 67 is a first part of the diagram for explaining the alkali metal cell fabricating method according to a tenth embodiment.

More specifically, as illustrated in FIG. 67, in an Si substrate 300 is formed an opening 310 to be a raw material chamber penetrating the Si substrate 300 and openings 321, 322, 323, and 324 to be cells. Moreover, there are provided a groove 331 between the opening 310 and the opening 321; a groove 332 between the opening 310 and the opening 322; a groove 333 between the opening 310 and the opening 323; and a groove 334 between the opening 310 and the opening 324. The respective openings are spatially connected by these grooves.

To the other face of the Si substrate 300 is bonded a first glass substrate (not shown). Moreover, a second glass substrate (not shown) is bonded to one face of the Si substrate 300 surrounding the opening 310 and the openings 321, 322, 323, and 324 by the first bonding metal layer 151 which is cooled after being heated to approximately 230° C.

Furthermore, a second bonding metal layer 152 is formed in a portion corresponding to the grooves 331, 332, 333, and 334 formed in Si substrate 300. Thus, the grooves may be blocked by the second bonding metal layer 152 formed in the second glass substrate by cooling the second bonding metal layer 152 after heating it to 280° C. or above after producing an alkali metal such as Cs, etc., by a compound material 140 containing the alkali metal.

Thereafter, a surrounding of an area in which the openings 321, 322, 323, and 324 are formed is cut by dicing, etc., making it possible to fabricate an alkali metal cell according to the present embodiment. In a case illustrated in FIG. 67, for example, this makes it possible to simultaneously fabricate four alkali metal cells against the opening 310 to be one raw material chamber by the openings 321, 322, 323, and 324. Thus, the alkali metal cell may be fabricated at low cost. The opening 310 according to the present embodiment corresponds to the first opening 111 in the first embodiment, while the openings 321, 322, 323, and 324 correspond to the second opening 112 in the first embodiment. Moreover, the grooves 331, 332, 333, and 334 correspond to the groove 113 in the first embodiment.

Figure 68:
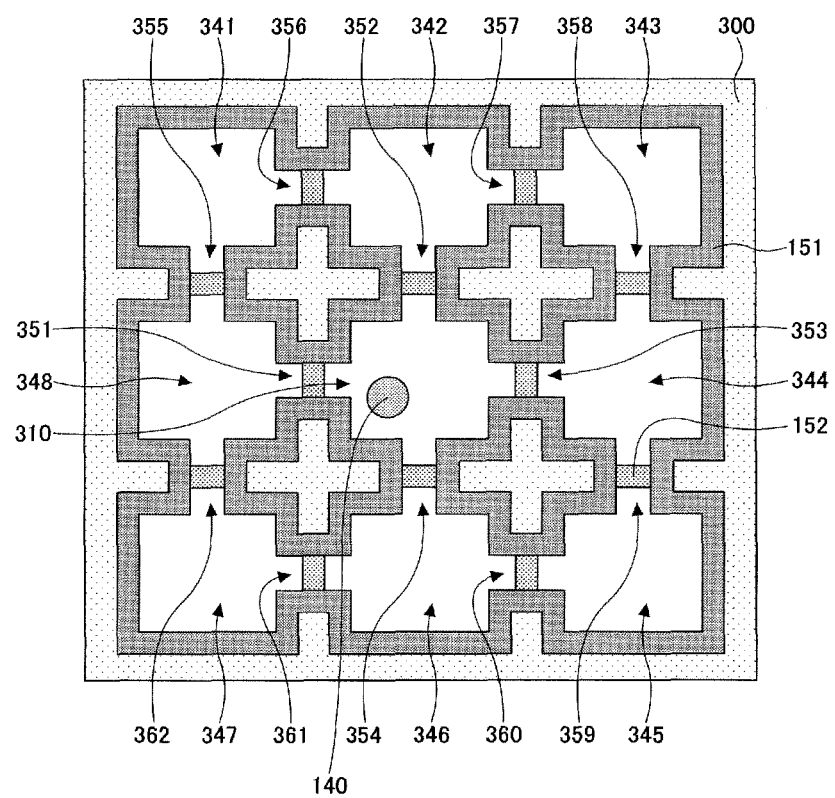
FIG. 68 is a second part of the diagram for explaining the alkali metal cell fabricating method according to the tenth embodiment.

Furthermore, as shown in FIG. 68, in the present embodiment, one opening 310 to be a raw material chamber and eight openings 341, 342, 343, 344, 345, 346, 347, and 348 to be cells may be formed. Grooves 351, 352, 353, 354, 355, 356, 357, 358, 359, 360, 361, and 362 are provided between neighboring openings 310, 341, 342, 343, 344, 345, 346, 347, and 348. The respective openings are spatially connected by these grooves. More specifically, there are provided the groove 351 between the opening 310 and the opening 348; the groove 352 between the opening 310 and the opening 342; the groove 353 between the opening 310 and the opening 344; and the groove 354 between the opening 310 and the opening 346. Moreover, there are provided the groove 355 between the opening 348 and the opening 341; the groove 356 between the opening 341 and the opening 342; the groove 357 between the opening 342 and the opening 343; and the groove 358 between the opening 343 and the opening 344. Furthermore, there are provided the groove 359 between the opening 344 and the opening 345; the groove 360 between the opening 345 and the opening 346; the groove 361 between the opening 346 and the opening 347; and the groove 362 between the opening 347 and the opening 348.

To the other face of the Si substrate 300 is bonded a first glass substrate (not shown) by anodic bonding. Moreover, a second glass substrate (not shown) is bonded to one face of the Si substrate 300 surrounding the opening 310 and the openings 341, 342, 343, 344, 345, 346, 347, and 348 by the first bonding metal layer 151 which is cooled after being heated to approximately 230° C.

Moreover, on one face of the second glass substrate, the second bonding metal layer 152 is formed in portions corresponding to the grooves 351, 352, 353, 354, 355, 356, 357, 358, 359, 360, 361, and 362. Thus, the grooves may be blocked by the second bonding metal layer 152 by cooling the second bonding metal layer 152 after melting the second bonding metal layer 152 formed on the second glass substrate by heating to 280° C. after producing the alkali metal such as Cs, etc., by the chemical material 140 containing the alkali metal.

Thereafter, a surrounding of an area in which the openings 341, 342, 343, 344, 345, 346, 347, and 348 are formed is cut by dicing, etc., making it possible to fabricate an alkali metal cell according to the present embodiment. In a case illustrated in FIG. 68, for example, this makes it possible to simultaneously fabricate eight alkali metal cells against the opening 310 to be one raw material chamber by the openings 341, 342, 343, 344, 345, 346, 347, and 348. Thus, the alkali metal cell may be fabricated at low cost.

Other features in the above embodiment are the same as those in the eighth embodiment. Moreover, the present embodiment is applicable to the second to the fifth, and the ninth embodiments.

While the embodiments of the present invention have been described in the foregoing, the present invention is not limited thereto. The present invention is based on and claims priority of Japanese Priority Application No. 2012-255466, filed on Nov. 21, 2012, Japanese Priority Application No. 2012-256053, filed on Nov. 22, 2012, and Japanese Priority Application No 2013-119739, filed on Jun. 6, 2013, the entire contents of which are hereby incorporated by reference.

The invention claimed is:

1. An alkali metal cell, comprising:
a substrate in which is formed an opening which penetrates from one face to the other face thereof;
a first transparent substrate bonded to the other face of the substrate; and
a second transparent substrate bonded to the one face of the substrate,
wherein an alkali metal is sealed into a space surrounded by the first transparent substrate and the second transparent substrate in the opening of the substrate,
wherein, in the substrate and the second transparent substrate, the space is enclosed by a bonding between a first bonding metal layer formed by a first bonding metal and a second bonding metal layer formed by a second bonding metal, and
wherein the second bonding metal layer has a bonding temperature higher than that of the first bonding metal layer.

2. The alkali metal cell as claimed in claim 1, wherein the first bonding metal layer is formed by a material containing Au.

3. The alkali metal cell as claimed in claim 1, wherein the second bonding metal layer is formed by a material containing any one of AuSn, AuGe, and AuSi.

4. The alkali metal cell as claimed in claim 1, wherein an interval between the substrate and the second transparent substrate is the same in an area bonded by the first bonding metal layer and an area bonded by the second bonding metal layer.

5. The alkali metal cell as claimed in claim 4, wherein there is an area which is not bonded by the first bonding metal layer and the second bonding metal layer between the substrate and the second transparent substrate and, in the area which is not bonded, there is a gap which allows alkali metal gas to enter.

6. The alkali metal cell as claimed in claim 1, wherein the first bonding metal is formed by a material containing AuSn.

7. The alkali metal cell as claimed in claim 1, wherein the first bonding metal and the second bonding metal are both formed by a material containing AuSn, wherein the first bonding metal contains more Sn than the second bonding metal.

8. The alkali metal cell as claimed in claim 1, wherein a groove which connects to the opening is formed on the one face of the substrate, and wherein
the substrate is bonded to the second transparent substrate by the second bonding metal layer in the groove.

9. The alkali metal cell as claimed in claim 1, wherein a groove is formed such that a front face side of the one face of the substrate is wider and a bottom face side thereof is narrower.

10. The alkali metal cell as claimed in claim 1, wherein the ether face of the substrate and the first transparent substrate are bonded by anodic bonding or direct bonding.

11. The alkali metal cell as claimed in claim 1, wherein the second transparent substrate is bonded to the substrate both by the first bonding metal layer having a first bonding temperature and by the second bonding metal layer having a second bonding temperature that is higher than the first bonding temperature of the first bonding metal layer.

12. An alkali metal cell fabricating method, comprising the steps of:
forming, in a substrate, two or more openings which penetrate the substrate;
bonding a first transparent substrate to another face of the substrate;
providing a compound containing an alkali metal in one opening of the openings;
forming a first bonding metal member formed by a first bonding metal around the two or more openings on one face of the substrate, or in a portion corresponding to the two or more openings on one face of a second transparent substrate;
providing a second bonding metal member formed by a second bonding metal in a portion corresponding to a gap between the opening and another opening on one face of the second transparent substrate or on one face of the substrate;
bonding the one face of the substrate and the one face of the second transparent substrate by a first bonding metal layer formed by applying the first bonding metal member;
forming, in between the one face of the substrate and the one face of the second transparent substrate, a gap which spatially connects the one opening and the other opening;
causing the alkali metal to be produced from the compound containing the alkali metal to supply the alkali metal to the other opening via the gap between the substrate and the second transparent substrate from the one opening; and
bonding the substrate and the second transparent substrate by the second bonding metal layer formed by heating the second bonding metal member in a portion corresponding to the gap between the one opening and the other opening after supplying the alkali metal to the other opening.

13. The alkali metal cell fabricating method as claimed in claim 12, wherein a thickness of the second bonding metal member formed by the second bonding metal provided in the portion corresponding to the gap between the one opening and the other opening is smaller than a thickness of the first bonding metal layer.

14. The alkali metal cell fabricating method as claimed in claim 12, wherein the gap between the one opening and the other opening is cut to separate the other opening and an inner part of the alkali metal cell is formed by the separated other opening.

15. The alkali metal cell fabricating method as claimed in claim 12, wherein the first bonding metal is formed by a metal fine particle.

16. The alkali metal cell fabricating method as claimed in claim 15, wherein the metal fine particle is a fine particle formed by a material containing Au; and wherein a particle diameter of the fine particle is between 0.05 μm and 1 μm.

* * * * *